United States Patent
Kim et al.

(10) Patent No.: US 12,453,085 B2
(45) Date of Patent: Oct. 21, 2025

(54) SEMICONDUCTOR MEMORY DEVICE HAVING CONNECTION PATTERN BETWEEN THE BIT LINE CONTACT AND THE SEPARATION INSULATING PATTERN

(71) Applicant: SAMSUNG ELECTRONICS CO., LTD., Suwon-si (KR)

(72) Inventors: Eunjung Kim, Suwon-si (KR); Sohyun Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 526 days.

(21) Appl. No.: 18/093,568

(22) Filed: Jan. 5, 2023

(65) Prior Publication Data

US 2023/0389299 A1 Nov. 30, 2023

(30) Foreign Application Priority Data

May 27, 2022 (KR) .................. 10-2022-0065304

(51) Int. Cl.
*H10B 12/00* (2023.01)
*H01L 23/528* (2006.01)

(52) U.S. Cl.
CPC ....... *H10B 12/485* (2023.02); *H01L 23/5283* (2013.01); *H10B 12/482* (2023.02); *H10B 12/488* (2023.02)

(58) Field of Classification Search
CPC .... H10B 12/053; H10B 12/315; H10B 12/34; H10B 12/482; H10B 12/485; H10B 12/488

USPC .................................. 257/906, 908
See application file for complete search history.

(56) References Cited

U.S. PATENT DOCUMENTS

| | | | |
|---|---|---|---|
| 6,218,271 | B1 | 4/2001 | Lee et al. |
| 6,251,725 | B1 | 6/2001 | Chiou et al. |
| 7,170,126 | B2 | 1/2007 | Cheng et al. |
| 9,214,382 | B2 | 12/2015 | Lee et al. |
| 9,230,612 | B2 | 1/2016 | Park |
| 9,379,114 | B2 | 6/2016 | Jeong et al. |
| 9,627,387 | B2 | 4/2017 | Jung et al. |

(Continued)

FOREIGN PATENT DOCUMENTS

| KR | 10-2012-0038070 A | 4/2012 |
|---|---|---|
| KR | 10-1928310 B1 | 12/2018 |

(Continued)

*Primary Examiner* — Hoai V Pham
(74) *Attorney, Agent, or Firm* — Muir Patent Law, PLLC

(57) ABSTRACT

A semiconductor memory device includes active patterns spaced apart from each other in first and second directions intersecting each other, each active pattern having a central portion, a first end portion, and a second end portion, bit line contacts disposed on the central portions and spaced apart from each other in the first and second directions, separation insulating patterns, each of which is disposed between the bit line contacts adjacent to each other in the first and second directions, intermediate insulating patterns, each of which is disposed between the bit line contact and the separation insulating pattern which are adjacent to each other in the first direction, and connection patterns, each of which is disposed between the bit line contact and the separation insulating pattern which are adjacent to each other in the second direction.

20 Claims, 24 Drawing Sheets

(56) References Cited

U.S. PATENT DOCUMENTS

| | | | |
|---|---|---|---|
| 9,679,982 B2 | 6/2017 | Kim et al. | |
| 10,453,796 B2 | 10/2019 | Song et al. | |
| 11,411,010 B2 | 8/2022 | Seong et al. | |
| 11,805,639 B2 | 10/2023 | Kim et al. | |
| 2019/0096890 A1 | 3/2019 | Lee et al. | |
| 2020/0203347 A1 | 6/2020 | Song et al. | |
| 2022/0037335 A1 | 2/2022 | Ma et al. | |
| 2022/0139918 A1 | 5/2022 | Lee | |
| 2023/0171948 A1* | 6/2023 | Yan | H10B 12/485 257/773 |

FOREIGN PATENT DOCUMENTS

| | | |
|---|---|---|
| KR | 10-1933044 B1 | 12/2018 |
| KR | 10-2019-0035250 A | 4/2019 |
| KR | 10-2059863 B1 | 12/2019 |
| KR | 10-2150965 B1 | 9/2020 |
| KR | 10-2021-0032843 A | 3/2021 |
| KR | 10-2283813 B1 | 8/2021 |
| TW | 202220143 | 9/2022 |

* cited by examiner

SEMICONDUCTOR MEMORY DEVICE HAVING CONNECTION PATTERN BETWEEN THE BIT LINE CONTACT AND THE SEPARATION INSULATING PATTERN

CROSS-REFERENCE TO RELATED APPLICATIONS

This U.S. non-provisional patent application claims priority under 35 U.S.C. § 119 to Korean Patent Application No. 10-2022-0065304, filed on May 27, 2022, in the Korean Intellectual Property Office, the entire contents of which are hereby incorporated by reference.

BACKGROUND

1. Field

The present disclosure relates to a semiconductor device, and more particularly, to a semiconductor memory device and a method of manufacturing the same.

2. Description of the Related Art

Semiconductor devices are widely used in an electronic industry because of their small sizes, multi-functional characteristics, and/or low manufacturing costs. However, semiconductor devices have been highly integrated with the development of the electronic industry. Widths of patterns included in semiconductor devices have been reduced to increase the integration density of semiconductor devices. However, since new exposure techniques and/or expensive exposure techniques are needed to form fine patterns, it is difficult to highly integrate semiconductor devices. Thus, various techniques of easily manufacturing semiconductor devices while increasing the integration density of semiconductor devices have been studied.

SUMMARY

In an aspect, a semiconductor memory device may include active patterns spaced apart from each other in a first direction and a second direction which intersect each other, the active patterns, each of which has a central portion, a first end portion, and a second end portion; bit line contacts disposed on the central portions and spaced apart from each other in the first and second directions; separation insulating patterns, each of which is disposed between the bit line contacts adjacent to each other in the first and second directions; intermediate insulating patterns, each of which is disposed between the bit line contact and the separation insulating pattern which are adjacent to each other in the first direction; and connection patterns, each of which is disposed between the bit line contact and the separation insulating pattern which are adjacent to each other in the second direction.

In an aspect, a semiconductor memory device may include active patterns spaced apart from each other in a first direction and a second direction which intersect each other, the active patterns, each of which has a central portion, a first end portion, and a second end portion; bit line contacts disposed on the central portions and spaced apart from each other in the first and second directions; separation insulating patterns, each of which extends in a third direction intersecting the first and second directions between the bit line contacts adjacent to each other; and connection patterns, each of which is disposed between the bit line contact and the separation insulating pattern which are adjacent to each other in the second direction.

In an aspect, a semiconductor memory device may include active patterns spaced apart from each other in a first direction and a second direction which intersect each other, the active patterns, each of which has a central portion, a first end portion, and a second end portion; word lines extending in the second direction in the active patterns; bit line contacts disposed on the central portions and spaced apart from each other in the first and second directions; bit lines extending in the first direction on the bit line contacts; separation insulating patterns, each of which is disposed between the bit line contacts adjacent to each other in the first and second directions; contact plugs provided between the bit lines; intermediate insulating patterns, each of which is disposed between the bit line contact and the separation insulating pattern which are adjacent to each other in the first direction; connection patterns, each of which connects each of the first and second end portions to each of the contact plugs between the bit line contact and the separation insulating pattern which are adjacent to each other in the second direction; landing pads on the contact plugs; and data storage patterns connected to the first and second end portions through the contact plugs and the landing pads.

In an aspect, a method of manufacturing a semiconductor memory device may include forming a device isolation pattern in a substrate to define active patterns, each of which includes a central portion, a first end portion, and a second end portion; forming connection lines, which are spaced apart from each other in a first direction and extend in a second direction intersecting the first direction, on the substrate; forming first recess regions spaced apart from the central portions in a plan view to divide the connection lines into preliminary connection patterns; forming separation insulating patterns filling the first recess regions; forming second recess regions on the central portions to divide the preliminary connection patterns into connection patterns; and forming bit line contacts disposed in the second recess regions.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
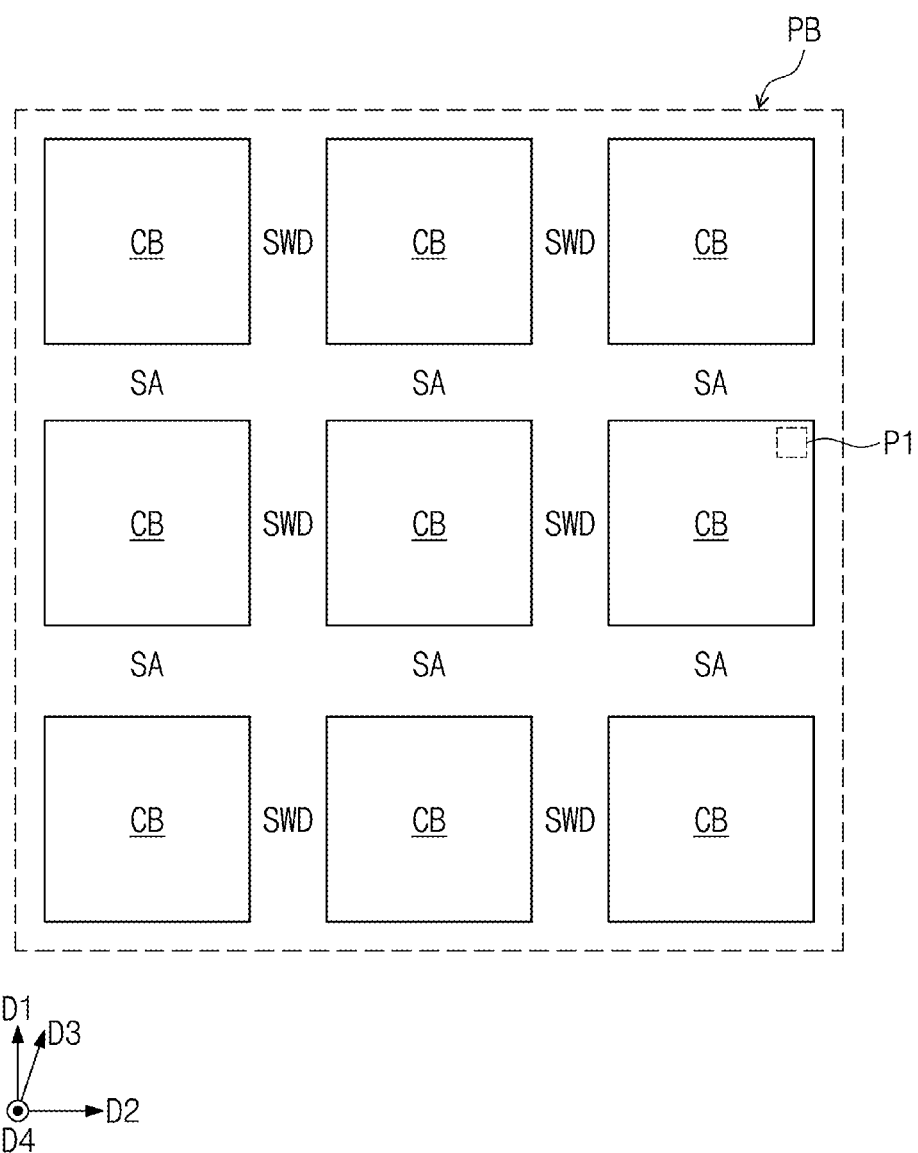
FIG. 1 is a block diagram illustrating a semiconductor memory device according to some embodiments.

FIG. 1 is a block diagram illustrating a semiconductor memory device according to some embodiments.

Referring to FIG. 1, a semiconductor memory device may include cell blocks CB and a peripheral block PB surrounding each of the cell blocks CB. Each of the cell blocks CB may include a cell circuit, e.g., a memory integrated circuit. The peripheral block PB may include various peripheral circuits required for operating the cell circuit, and the peripheral circuits may be electrically connected to the cell circuit.

The peripheral block PB may include sense amplifier circuits SA and sub-word line driver circuits SWD. For example, the sense amplifier circuits SA may face each other with the cell block CB interposed therebetween, and the sub-word line driver circuits SWD may face each other with the cell block CB interposed therebetween. The peripheral block PB may further include, e.g., power and ground driver circuits for driving the sense amplifier.

Figure 2:
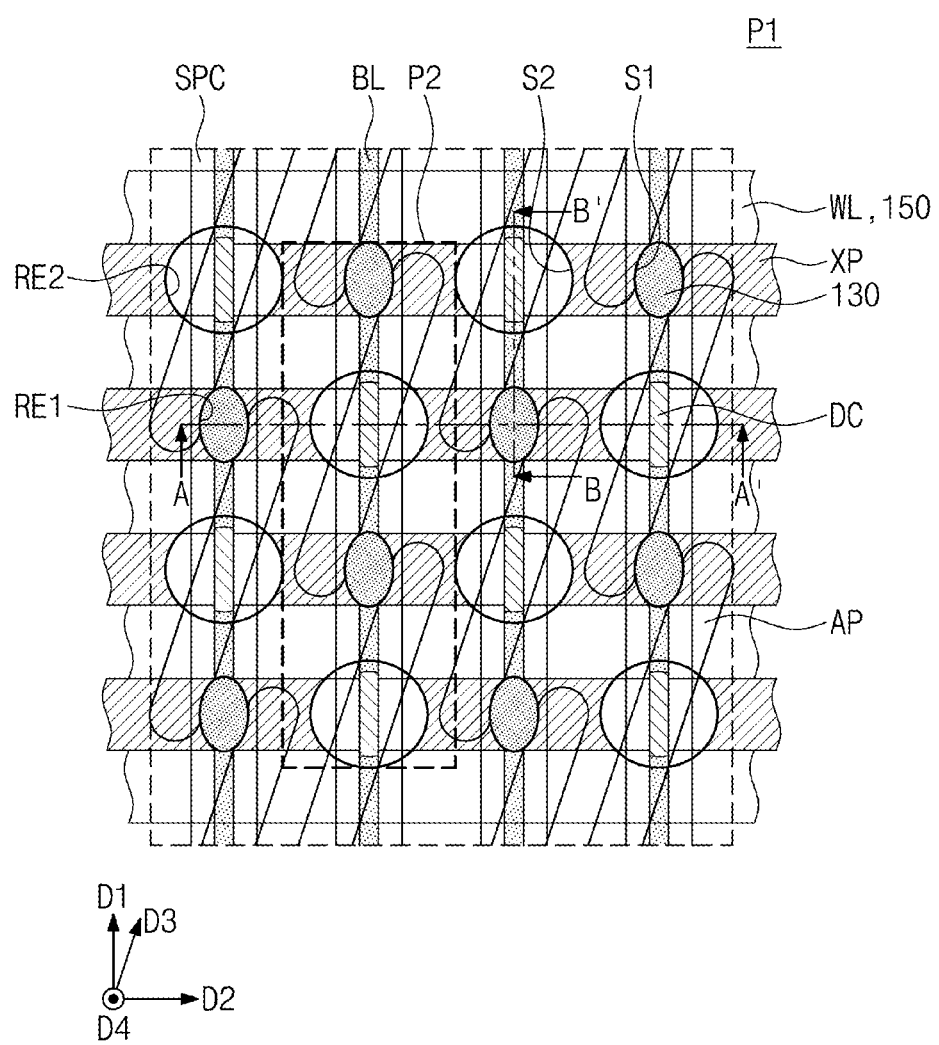
FIG. 2 is a plan view of portion 'P1' of FIG. 1.
Figure 3:
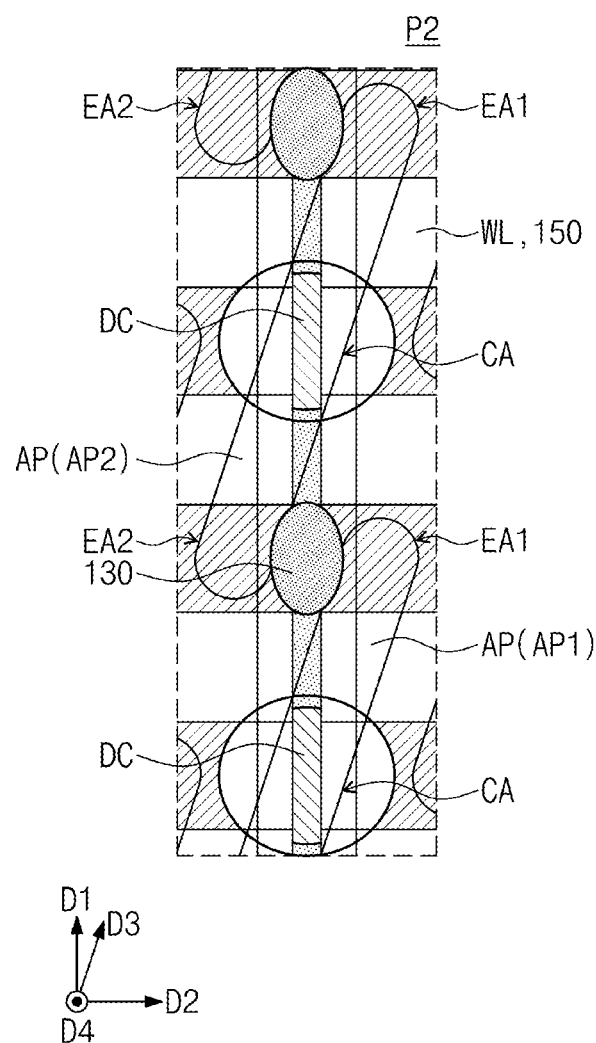
FIG. 3 is an enlarged view of portion 'P2' of FIG. 2.
Figure 4A:
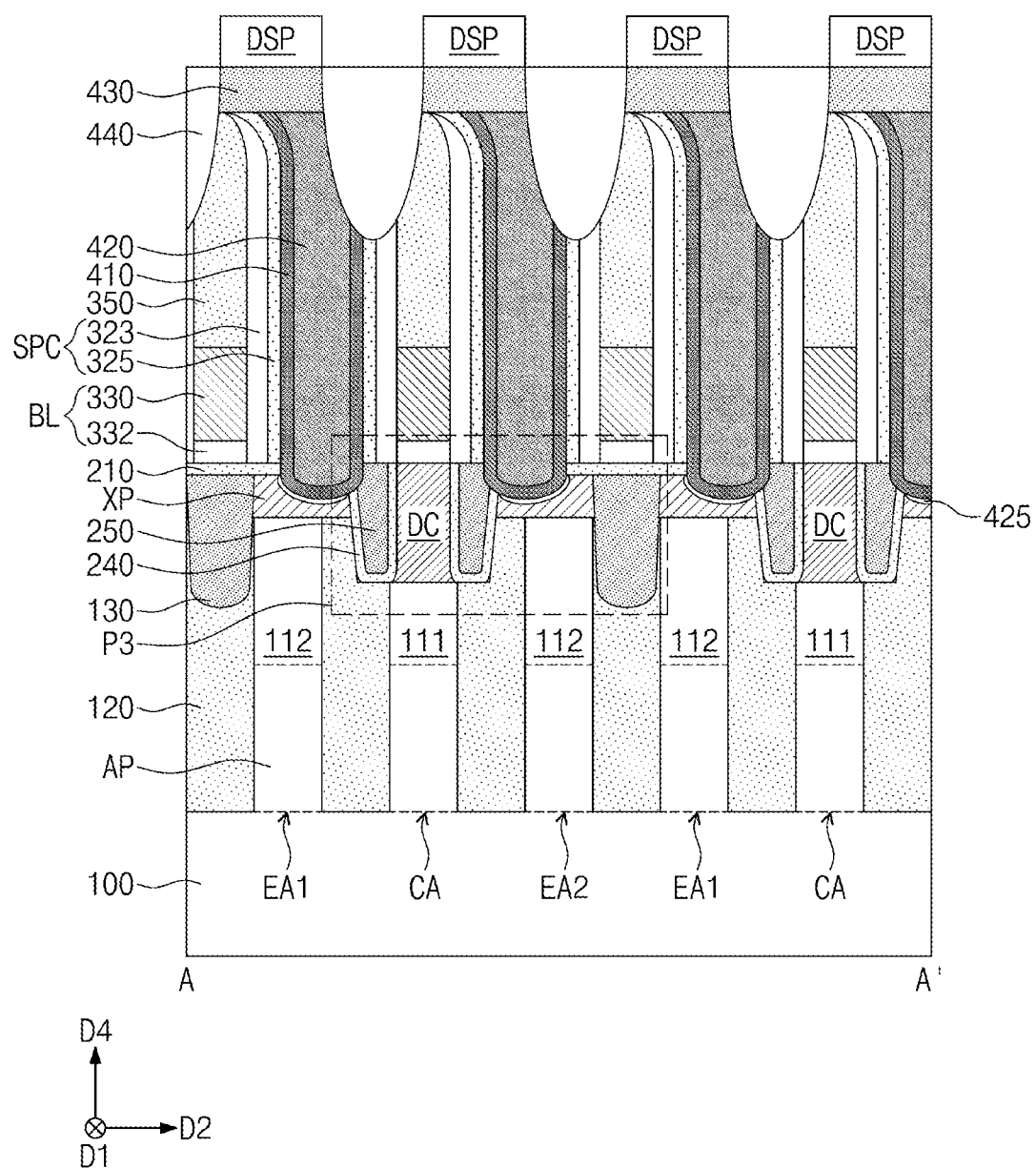
FIGS. 4A and 4B are cross-sectional views along lines A-A' and B-B' of FIG. 2, respectively.
Figure 4B:
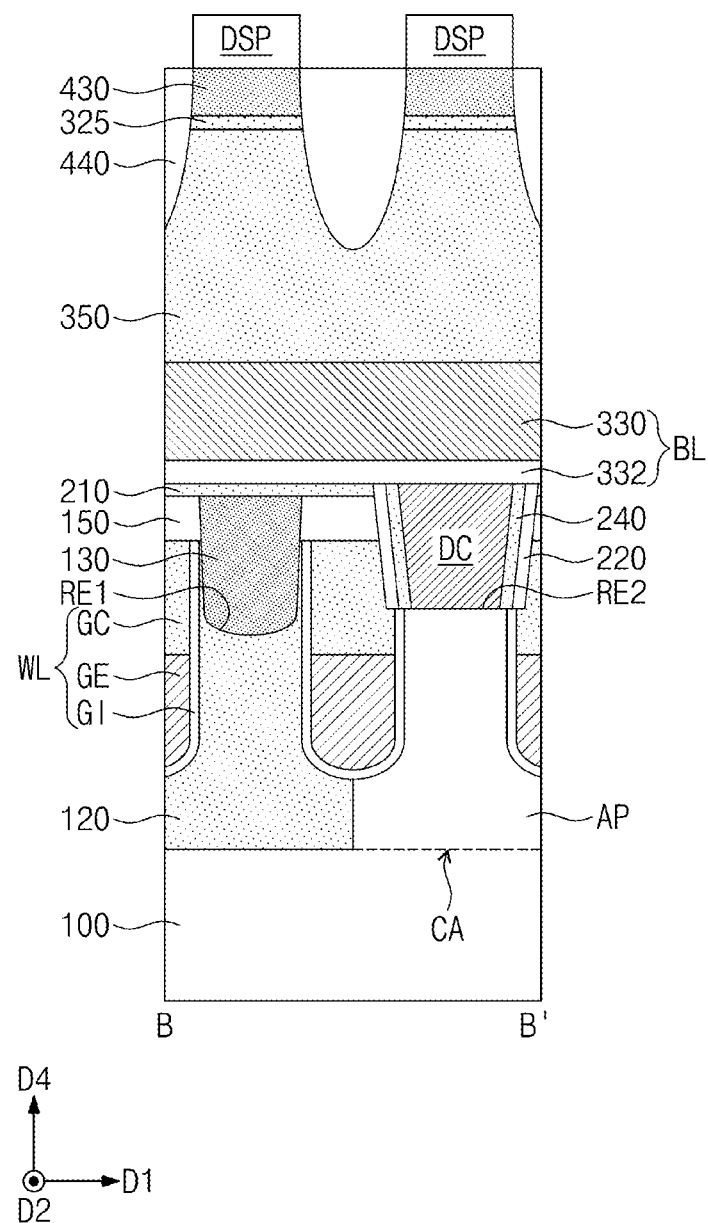
Figure 5:
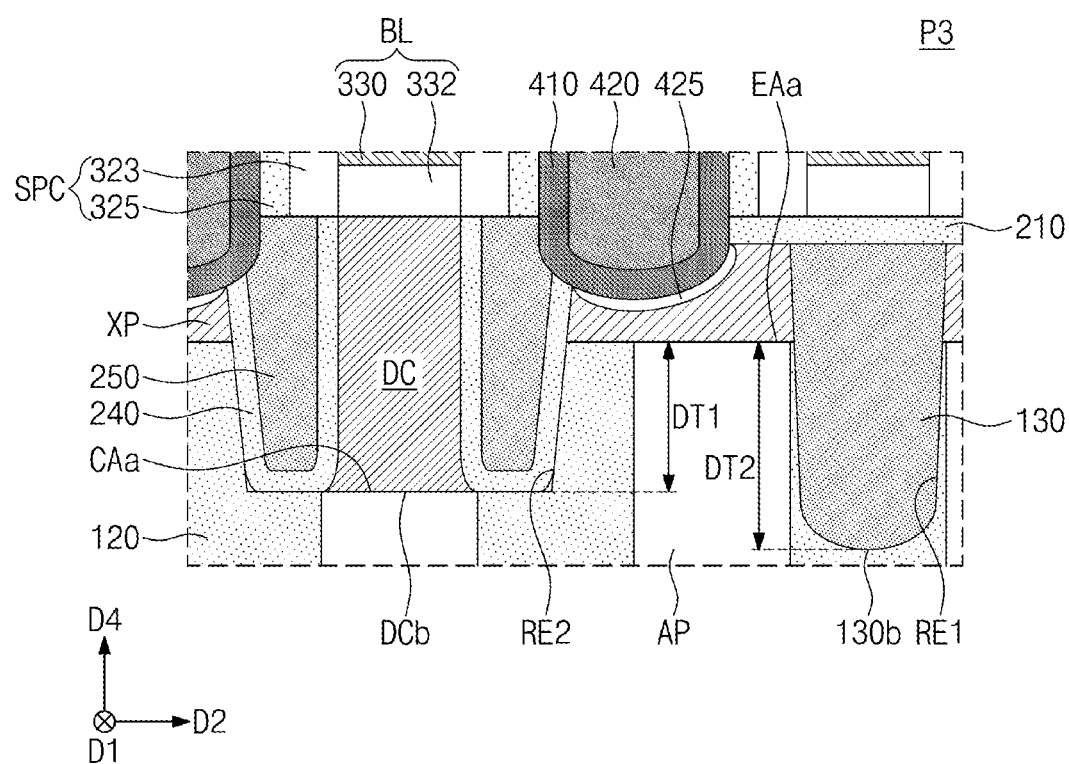
FIGS. 5 and 6 are enlarged views of portion 'P3' of FIG. 4A.

FIG. 2 is a plan view corresponding to portion 'P1' in a cell block CB of FIG. 1 to illustrate a semiconductor memory device according to some embodiments. FIG. 3 is an enlarged view of portion 'P2' of FIG. 2. FIGS. 4A and 4B are cross-sectional views taken along lines A-A' and B-B' of FIG. 2, respectively. FIG. 5 is an enlarged view of portion 'P3' of FIG. 4A.

Referring to FIGS. 2, 3, 4A, 4B and 5, a substrate 100 may be provided. The substrate 100 may be a semiconductor substrate, e.g., a silicon substrate, a germanium substrate, or a silicon-germanium substrate.

A device isolation pattern 120 may be disposed in the substrate 100 and may define active patterns AP. The active patterns AP may be spaced apart from each other in a first direction D1 and a second direction D2, which intersect (e.g., are perpendicular to) each other. The first direction D1 and the second direction D2 may be parallel to a bottom surface of the substrate 100. The active patterns AP may have island shapes separated from each other, and each of the active patterns AP may have a bar shape extending lengthwise in a third direction D3. The third direction D3 may be parallel to the bottom surface of the substrate 100 and may intersect the first and second directions D1 and D2. The active patterns AP may be portions of the substrate 100, which are surrounded by the device isolation pattern 120 when viewed in a plan view. The active patterns AP may have shapes protruding in a fourth direction D4 perpendicular to the bottom surface of the substrate 100. The device isolation pattern 120 may include an insulating material, e.g., at least one of silicon oxide or silicon nitride.

Word lines WL may be provided in the active patterns AP. The word lines WL may extend in the second direction D2 and may be spaced apart from each other in the first direction D1. The word lines WL may be disposed in trenches provided in the active patterns AP and the device isolation pattern 120. For example, a pair of the word lines WL adjacent to each other in the first direction D1 may intersect each of the active patterns AP.

Each of the word lines WL may include a gate electrode GE, a gate dielectric pattern GI, and a gate capping pattern GC. The gate electrode GE may penetrate the active patterns AP and the device isolation pattern 120 in the second direction D2. The gate dielectric pattern GI may be disposed between the gate electrode GE and the active patterns AP, and between the gate electrode GE and the device isolation pattern 120. The gate capping pattern GC may be disposed on the gate electrode GE to cover the gate electrode GE.

Each of the active patterns AP may have a central portion CA, a first end portion EA1, and a second end portion EA2. The central portion CA may be a portion of the active pattern AP disposed between the pair of word lines WL intersecting the active pattern AP. The first and second end portions EA1 and EA2 may be other portions of the active pattern AP provided at both edges of the active pattern AP in the third direction D3. For example, top surfaces CAa of the central portions CA may be located at a lower height (or level) than top surfaces EAa of the first and second end portions EA1 and EA2.

For example, as illustrated in FIG. 3, the active patterns AP may include a first active pattern AP1 and a second active pattern AP2, which are adjacent to each other in the first direction D1. The first end portion EA1 of the first active pattern AP1 may be disposed adjacent to the second end portion EA2 of the second active pattern AP2. For example, the first end portion EA1 of the first active pattern AP1 may be adjacent to the second end portion EA2 of the second active pattern AP2 in the second direction D2.

First dopant regions 111 may be provided in the central portions CA, and second dopant regions 112 may be provided in the first and second end portions EA1 and EA2. The first dopant regions 111 may include dopants having the same conductivity type (e.g., an N-type) as those of the second dopant regions 112.

A bit line contact DC may be disposed on the central portion CA of each of the active patterns AP. The bit line contact DC may be provided in plurality, and the bit line contacts DC may be spaced apart from each other in the first and second directions D1 and D2. Each of the bit line contacts DC may be connected to a corresponding first dopant region 111 (i.e., a corresponding central portion CA).

Second recess regions RE2 may be provided on the central portions CA, and each of the second recess regions RE2 may be defined as a region surrounded by the central portion CA, the device isolation pattern 120, intermediate insulating patterns 150 to be described later, and connection patterns XP to be described later. For example, the device isolation pattern 120, the intermediate insulating patterns 150, and the connection patterns XP may be exposed by inner side surfaces of the second recess regions RE2. Each of the bit line contacts DC may be disposed in each of the second recess regions RE2. For example, at least a portion of each of the bit line contacts DC may be disposed in each of the second recess regions RE2. A bottom surface DCb of the bit line contact DC may be located at a lower height than a top surface of the device isolation pattern 120 and the top surfaces EAa of the first and second end portions EA1 and EA2. The bit line contact DC may include dopant-doped or undoped poly-silicon.

A contact spacer 220 may be provided on a portion of the inner side surface of each of the second recess regions RE2. The contact spacer 220 may be disposed between a corresponding bit line contact DC and a corresponding gate capping pattern GC and may extend between the corresponding bit line contact DC and the intermediate insulating pattern 150 to be described later. The contact spacer 220 may include at least one of, e.g., silicon nitride, silicon oxide, or silicon oxynitride, and may be a single layer or multi-layer.

A first filling pattern 240 and a second filling pattern 250 may fill a remaining portion of the second recess region RE2. The first filling pattern 240 may be disposed between the contact spacer 220 and the corresponding bit line contact DC. Each of the first filling pattern 240 and the second filling pattern 250 may include at least one of, e.g., silicon nitride, silicon oxide, or silicon oxynitride, and may be a single layer or multi-layer.

A separation insulating pattern 130 may be disposed between the bit line contacts DC adjacent to each other in the first and second directions D1 and D2 when viewed in a plan view. The separation insulating pattern 130 may be disposed between the word lines WL adjacent to each other in the first direction D1. The separation insulating pattern 130 may be provided in plurality, and the separation insulating patterns 130 may be spaced apart from each other in the first and second directions D1 and D2. The separation insulating patterns 130 may be disposed adjacent to the first and second end portions EA1 and EA2. For example, each of the separation insulating patterns 130 may be disposed between the first end portion EA1 of one active pattern AP1 of a pair of the active patterns AP adjacent to each other in the first direction D1 and the second end portion EA2 of the other active pattern AP2 of the pair of active patterns AP.

First recess regions RE1 may be provided adjacent to the first and second end portions EA1 and EA2, and each of the first recess regions RE1 may be defined as a region surrounded by the device isolation pattern 120 and the connection patterns XP to be described later between the first and second end portions EA1 and EA2. The separation insulating patterns 130 may be provided in the first recess regions RE1 and may penetrate an upper portion of the device isolation pattern 120.

Bottom surfaces of the second recess regions RE2 may be located at a higher height than bottom surfaces of the first recess regions RE1, e.g., relative to the bottom of the substrate 100. The bottom surfaces DCb of the bit line contacts DC may be located at a higher height than bottom surfaces 130b of the separation insulating patterns 130. A depth DT1 from the top surfaces EAa of the first and second end portions EA1 and EA2 to the bottom surfaces DCb of the bit line contacts DC may be less than a depth DT2 from the top surfaces EAa of the first and second end portions EA1 and EA2 to the bottom surfaces 130b of the separation insulating patterns 130.

Each of the separation insulating patterns 130 may have a circular or elliptical shape when viewed in a plan view. For example, each of the separation insulating patterns 130 may have a shape convex in the first and second directions D1 and D2. Thus, a width, in the second direction D2, of a central portion of each of the separation insulating patterns 130 may be greater than a width, in the second direction D2, of an edge portion of each of the separation insulating patterns 130, e.g., as viewed in a plan view of FIG. 3. In the descriptions related to the width in the second direction D2, the central portion of the separation insulating pattern 130 may be defined as a portion spaced apart from the word lines WL adjacent thereto by equal distances, e.g., the central portion of the separation insulating pattern 130 may be equidistant from each adjacent word line WL in the first direction D1 (FIG. 3). The edge portions of the separation insulating pattern 130 may be defined as portions vertically overlapping with the adjacent word lines WL, e.g., the edge portions of the separation insulating pattern 130 may be defined as opposite portions of the separation insulating pattern 130 along the first direction D1 that are adjacent the word lines WL (FIG. 3). However, the shapes of the separation insulating patterns 130 are not limited thereto, and in certain embodiments, each of the separation insulating patterns 130 may have a polygonal shape. The separation insulating patterns 130 may include at least one of, e.g., silicon oxide, silicon nitride, or silicon oxynitride, and may be a single layer or multi-layer.

An intermediate insulating pattern 150 may be disposed between the bit line contact DC and the separation insulating pattern 130, which are adjacent to each other in the first direction D1. The intermediate insulating pattern 150 may be provided in plurality, and the intermediate insulating patterns 150 may be spaced apart from each other in the first direction D1. For example, the intermediate insulating patterns 150 may extend in the second direction D2. At least a portion of the intermediate insulating pattern 150 may vertically overlap with the word line WL and may cover a top surface of the word line WL (i.e., a top surface of the gate capping pattern GC). A bottom surface of the intermediate insulating pattern 150 may be located at a higher height than the bottom surface 130b of the separation insulating pattern 130, e.g., relative to the bottom of the substrate 100. A top surface of the intermediate insulating pattern 150 may be located at substantially the same height as a top surface of the separation insulating pattern 130 and may be substantially coplanar with the top surface of the separation insulating pattern 130.

The bit line contacts DC may include a line of the bit line contacts DC arranged in the first direction D1, e.g., the bit line contacts DC may be arranged in a first line in the first direction D1. The separation insulating patterns 130 may include a line of the separation insulating patterns 130 arranged in the first direction D1, e.g., the separation insulating patterns 130 may be arranged in a second line in the first direction D1. Each of the line of bit line contacts DC and each of the line of separation insulating patterns 130 may be alternately arranged in the first direction D1, e.g., the first line and the second line of the bit line contacts DC and the separation insulating patterns 130 may be arranged alternately in the first direction D1 to define a third line. Each of the intermediate insulating patterns 150 may be provided between each of the line of bit line contacts DC and each of the line of separation insulating patterns 130.

A connection pattern XP may be disposed between the separation insulating pattern 130 and the bit line contact DC, which are adjacent to each other in the second direction D2. The connection pattern XP may be disposed between the intermediate insulating patterns 150 adjacent to each other in the first direction D1 when viewed in a plan view. The connection pattern XP may be provided in plurality, and the connection patterns XP may be spaced apart from each other in the first and second directions D1 and D2.

A single separation insulating pattern 130 may be provided between a pair of the connection patterns XP, and the pair of connection patterns XP may be spaced apart from each other in the second direction D2 by the separation insulating pattern 130. A width, in the first direction D1, of a central portion of the separation insulating pattern 130 may be substantially equal to or greater than a width, in the first direction D1, of each of the pair of connection patterns XP. In the descriptions related to the width in the first direction D1, the central portion of the separation insulating pattern 130 may be defined as a portion spaced apart from the pair of connection patterns XP by equal distances. The pair of connection patterns XP may be mirror-symmetrical with respect to the separation insulating pattern 130. The connection pattern XP may be spaced apart from other connection patterns XP adjacent thereto in the first direction D1 by the intermediate insulating patterns 150.

The connection pattern XP may include a first surface S1 facing an adjacent separation insulating pattern 130 and a second surface S2 facing an adjacent bit line contact DC. For example, the first surface S1 may have a profile concavely recessed from the adjacent separation insulating pattern 130 when viewed in a plan view. For example, the second surface S2 may have a profile concavely recessed from the adjacent bit line contact DC when viewed in a plan view. For example, the first surface S1 may be formed along a profile of an adjacent first recess region RE1, and the second surface S2 may be formed along a profile of an adjacent second recess region RE2. A width, in the second direction D2, of a central portion of the connection pattern XP may be less than a width, in the second direction D2, of an edge portion of the connection pattern XP. The central portion of the connection pattern XP may be defined as a portion spaced apart from adjacent word lines WL by equal distances. The edge portions of the connection pattern XP may be defined as some surfaces of the connection pattern XP, which face the first direction D1.

Each of the connection patterns XP may be connected to a corresponding second dopant region 112 (i.e., a corresponding first end portion EA1 or a corresponding second end portion EA2). Top surfaces of the connection patterns XP may be located at substantially the same height as the top surfaces of the separation insulating patterns 130. Bottom surfaces of the connection patterns XP may be located at substantially the same height as or a higher height than the bottom surfaces DCb of the bit line contacts DC. For example, as illustrated in FIG. 5, the bottom surfaces of the connection patterns XP may be located at a higher height than the bottom surfaces DCb of the bit line contacts DC. For example, the connection patterns XP may include dopant-doped or undoped poly-silicon, or a metal material.

The bit line contacts DC may include a line of the bit line contacts DC arranged in the second direction D2. The separation insulating patterns 130 may include a line of the separation insulating patterns 130 arranged in the second direction D2. Each of the line of bit line contacts DC and each of the line of separation insulating patterns 130 may be alternately arranged in the second direction D2. The connection patterns XP may include a line of the connection patterns XP arranged in the second direction D2. Each of the line of connection patterns XP may be provided between each of the line of bit line contacts DC and each of the line of separation insulating patterns 130.

A bit line BL may be provided on the bit line contacts DC and the separation insulating patterns 130. The bit line BL may be provided in plurality. The bit lines BL may extend in the first direction D1 and may be spaced apart from each other in the second direction D2. The bit line BL may be provided on the bit line contacts DC and the separation insulating patterns 130, which are alternately arranged in the first direction D1 when viewed in a plan view.

The bit line BL may include a metal-containing pattern 330 and a first barrier pattern 332 between the metal-containing pattern 330 and the separation insulating pattern 130. The metal-containing pattern 330 may include at least one of a metal material (e.g., tungsten, titanium, and/or tantalum) or a semiconductor material. The first barrier pattern 332 may include a conductive metal nitride (e.g., titanium nitride, tungsten nitride, and/or tantalum nitride). A buffer pattern 210 may be disposed between the bit line BL and the separation insulating pattern 130 and may cover the top surface of the separation insulating pattern 130 and the top surface of the connection pattern XP. The buffer pattern 210 may include at least one of e.g., silicon oxide, silicon nitride, or silicon oxynitride, and may be a single layer or multi-layer.

A bit line capping pattern 350 may extend in the first direction D1 on each of the bit lines BL. For example, the bit line capping pattern 350 may include silicon nitride.

A bit line spacer SPC may cover a side surface of the bit line BL and a side surface of the bit line capping pattern 350. The bit line spacer SPC may extend in the first direction D1 on the side surface of the bit line BL. The bit line spacer SPC may be provided in plurality, and the bit line spacers SPC may be spaced apart from each other in the second direction D2.

The bit line spacer SPC may be a single layer or multi-layer. For example, the bit line spacer SPC may include an inner spacer 323 and an outer spacer 325, which are sequentially stacked on the side surface of the bit line BL. The outer spacer 325 may extend onto a top surface of the bit line capping pattern 350. For example, the inner spacer 323 may include silicon oxide. In certain embodiments, the inner spacer 323 may be an empty space (i.e., an air gap) including an air layer. For example, the outer spacer 325 may include silicon nitride. However, embodiments are not limited thereto, e.g., the bit line spacer SPC may be formed of a single layer or three or more layers.

A contact plug 420 may be provided between the bit lines BL adjacent to each other. The contact plug 420 may be provided in plurality, and the contact plugs 420 may be spaced apart from each other in the first and second directions D1 and D2. Even though not shown in the drawings, the contact plugs 420 may be spaced apart from each other in the first direction D1 by fence patterns on the word lines WL. For example, the fence patterns may include silicon nitride.

The contact plug 420 may be connected to a corresponding connection pattern XP. The contact plug 420 may be connected to a corresponding second dopant region 112 (i.e., a corresponding first end portion EA1 or a corresponding second end portion EA2) through the corresponding connection pattern XP. An upper portion of the contact plug 420 may be shifted, e.g., horizontally offset, from a lower portion of the contact plug 420 in the second direction D2. The contact plug 420 may include dopant-doped or undoped poly-silicon, or a metal material.

A second barrier pattern 410 may be provided between the contact plug 420 and the bit line spacer SPC, and between the contact plug 420 and the connection pattern XP. The second barrier pattern 410 may include a conductive metal nitride (e.g., titanium nitride, tungsten nitride, and/or tantalum nitride). An ohmic pattern 425 may be provided between the second barrier pattern 410 and the connection pattern XP. The ohmic pattern 425 may include a metal silicide.

A landing pad 430 may be provided on the contact plug 420. The landing pad 430 may be provided in plurality, and the landing pads 430 may be spaced apart from each other in the first and second directions D1 and D2. The landing pad 430 may be connected to a corresponding contact plug 420. The landing pad 430 may cover the top surface of the bit line capping pattern 350. The landing pad 430 may include a metal material (e.g., tungsten, titanium, and/or tantalum).

A gap-fill pattern 440 may surround each of the landing pads 430 when viewed in a plan view. The gap-fill pattern 440 may be disposed between the landing pads 430 adjacent to each other. The gap-fill pattern 440 may have a mesh shape including holes in which the landing pads 430 are disposed, when viewed in a plan view. For example, the gap-fill pattern 440 may include at least one of silicon nitride, silicon oxide, or silicon oxynitride. In certain embodiments, the gap-fill pattern 440 may be an empty space (i.e., an air gap) including an air layer.

A data storage pattern DSP may be provided on the landing pad 430. The data storage pattern DSP may be provided in plurality, and the data storage patterns DSP may be spaced apart from each other in the first and second directions D1 and D2. The data storage pattern DSP may be connected to a corresponding second dopant region 112 (i.e., a corresponding first end portion EA1 or a corresponding second end portion EA2) through a corresponding landing pad 430, a corresponding contact plug 420, and a corresponding connection pattern XP.

In some examples, the data storage pattern DSP may be a capacitor including a lower electrode, a dielectric layer, and an upper electrode. In this case, the semiconductor memory device according to embodiments may be a dynamic random access memory (DRAM) device. For certain examples, the data storage pattern DSP may include a magnetic tunnel junction pattern. In this case, the semiconductor memory device according to embodiments may be a magnetic random access memory (MRAM) device. For certain examples, the data storage pattern DSP may include a phase-change material or a variable resistance material. In this case, the semiconductor memory device according to embodiments may be a phase-change random access memory (PRAM) device or a resistive random access memory (ReRAM) device. However, embodiments are not limited thereto, e.g., the data storage pattern DSP may include at least one of other various structures and/or materials capable of storing data.

Figure 6:
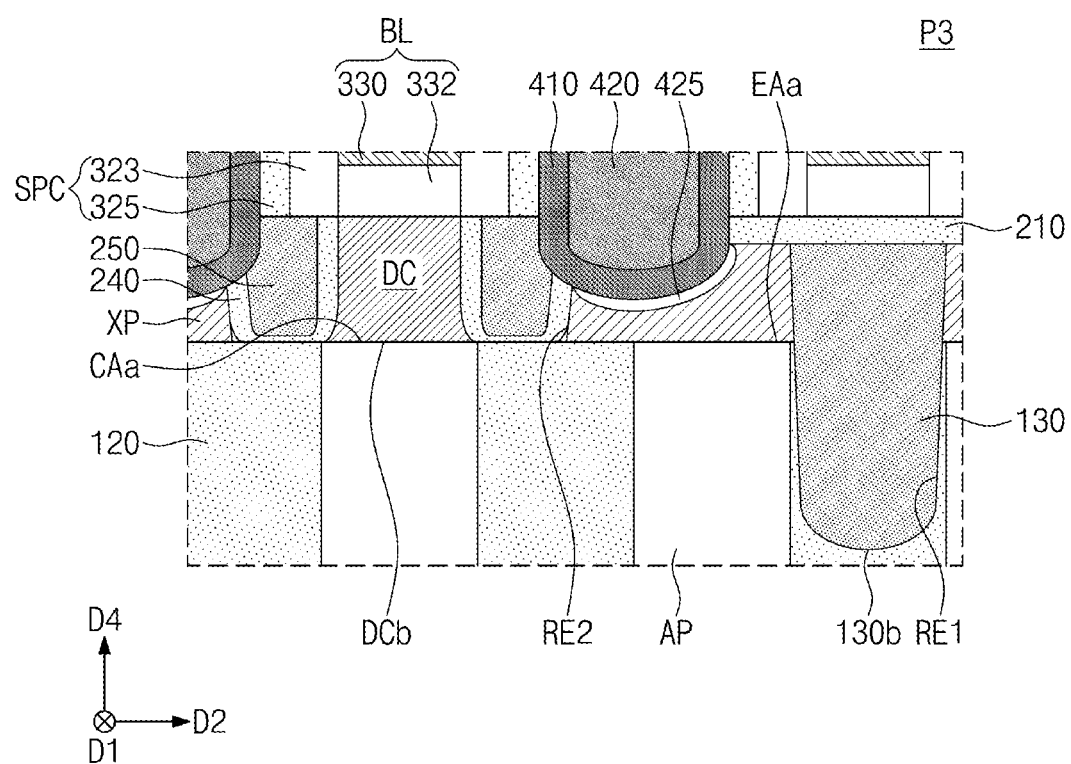

FIG. 6 is an enlarged view of portion 'P3' of FIG. 4A (i.e., corresponding to FIG. 5). Hereinafter, the descriptions to the same features and components as mentioned above will be omitted for the purpose of ease and convenience in explanation.

Referring to FIG. 6, bit line contacts DC may be provided in the second recess regions RE2 on the central portions CA of the active patterns AP. The second recess regions RE2 may be provided at a higher height than top surfaces EAa of the first and second end portions EA1 and EA2 of the active patterns AP. Top surfaces CAa of the central portions CA may be exposed by bottom surfaces of the second recess regions RE2, and the top surfaces CAa of the central portions CA may be located at substantially the same height as the top surfaces EAa of the first and second end portions EA1 and EA2. For example, the bottom surfaces DCb of the bit line contacts DC may be located at substantially the same height as the bottom surfaces of the connection patterns XP and may be located at a higher height than the bottom surface 130b of the separation insulating pattern 130.

Figure 7:
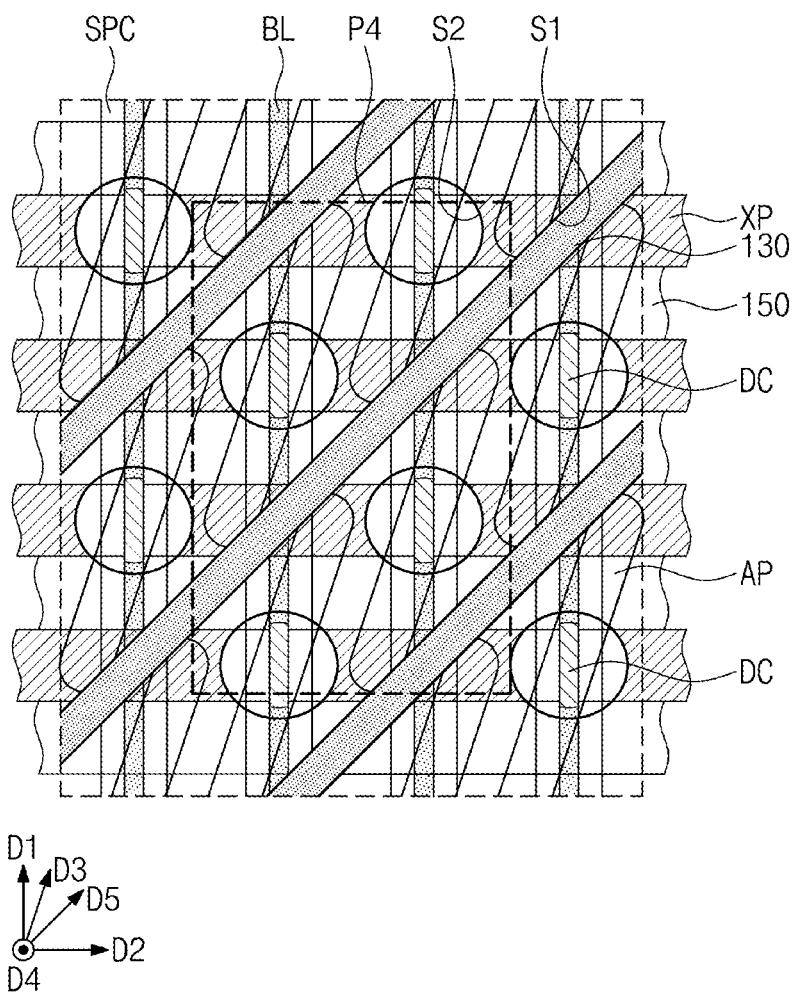
FIG. 7 is a plan view of portion 'P1' of FIG. 1.
Figure 8:
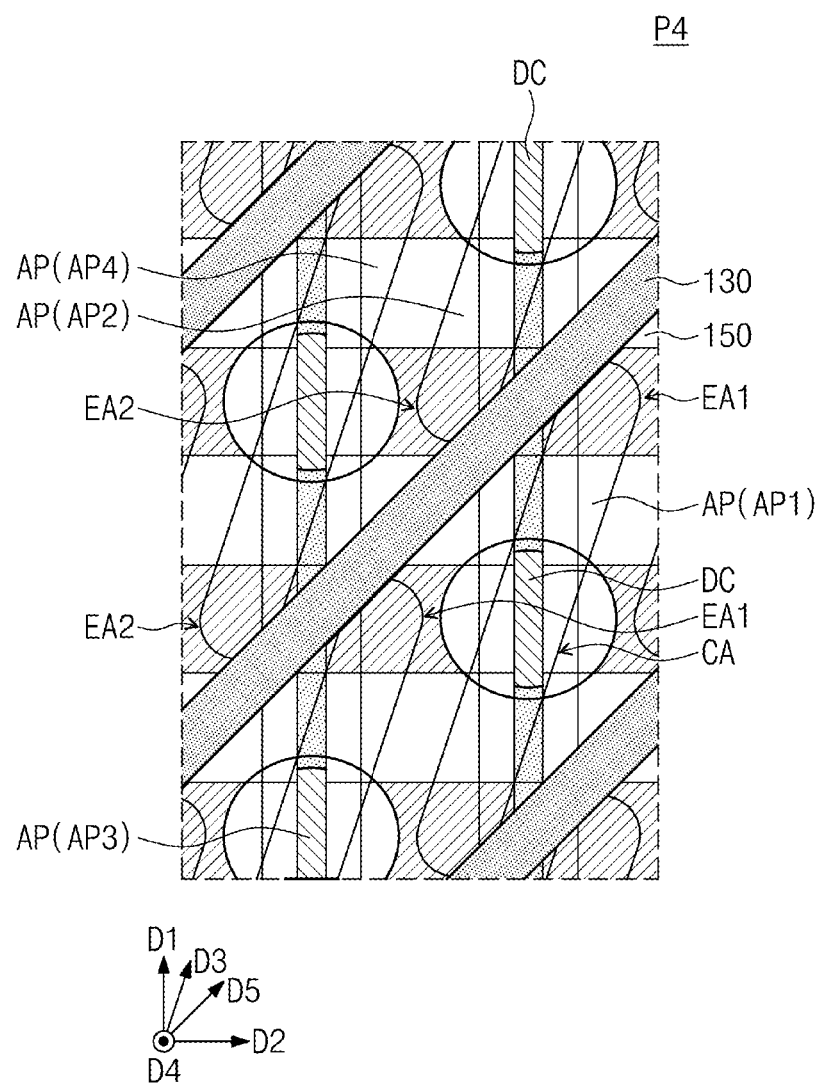
FIG. 8 is an enlarged view of portion 'P4' of FIG. 7.
Figure 9:
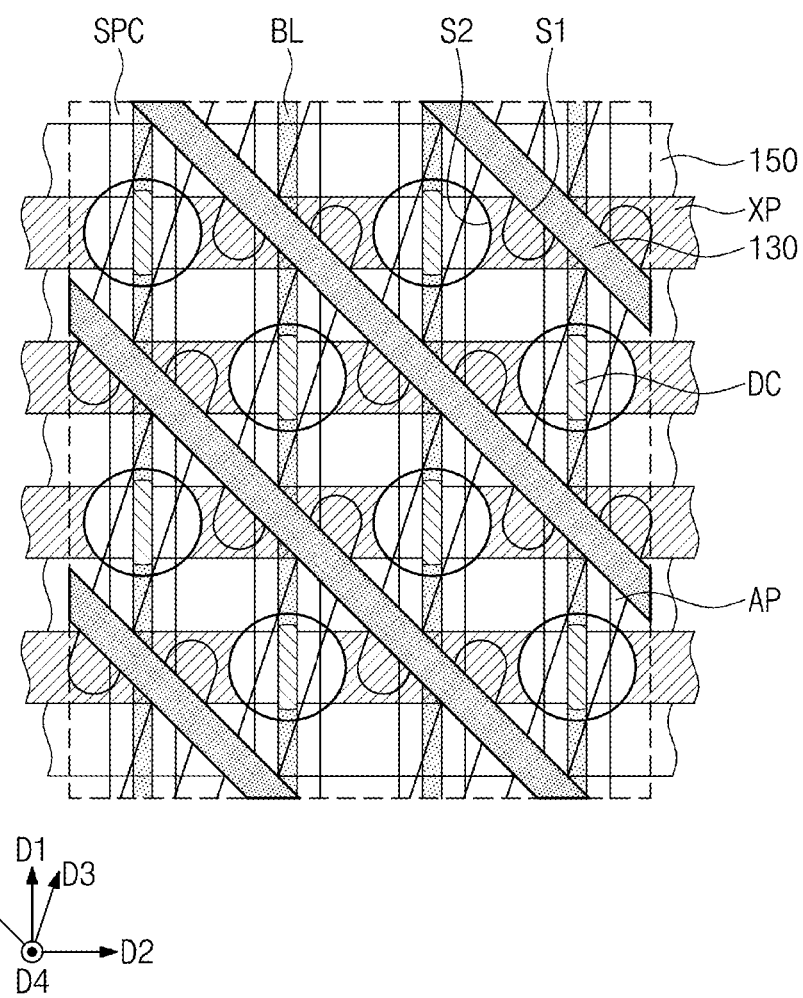
FIG. 9 is a plan view of portion 'P1' of FIG. 1.

FIGS. 7 and 9 are plan views corresponding to portion 'P1' of FIG. 1 to illustrate semiconductor memory devices according to some embodiments. FIG. 8 is an enlarged view of portion 'P4' of FIG. 7. Hereinafter, the descriptions to the same features and components as mentioned above will be omitted for the purpose of ease and convenience in explanation.

Referring to FIGS. 7 and 8, the separation insulating patterns 130 may extend in a fifth direction D5. The fifth direction D5 may intersect the first to third directions D1, D2 and D3, and may be parallel to the bottom surface of the substrate 100. Each of the separation insulating patterns 130 may be disposed between the bit line contacts DC adjacent to each other and may be spaced apart from the adjacent bit line contacts DC. The bit line contacts DC may be disposed between the separation insulating patterns 130 adjacent to each other, and a line of the bit line contacts DC may be arranged in the fifth direction D5 between the adjacent separation insulating patterns 130.

For example, as illustrated in FIG. 8, a first active pattern AP1 and a second active pattern AP2 may be provided to be adjacent to each other in the first direction D1. A third active pattern AP3 may be provided to be adjacent to the first active pattern AP1 in the second direction D2. A fourth active pattern AP4 may be provided to be adjacent to the third active pattern AP3 in the first direction D1 and may be adjacent to the second active pattern AP2 in the second direction D2. One of the separation insulating patterns 130 may cross between a first end portion EA1 of the first active pattern AP1 and a second end portion EA2 of the second active pattern AP2 and between a first end portion EA1 of the third active pattern AP3 and a second end portion EA2 of the fourth active pattern AP4 in the fifth direction D5. Here, one separation insulating pattern 130 may be spaced apart from the bit line contacts DC and may extend in the fifth direction D5.

Each of intermediate insulating patterns 150 may be disposed between the bit line contact DC and the separation insulating pattern 130, which are adjacent to each other in the first direction D1. Each of the intermediate insulating patterns 150 may have a bar shape extending lengthwise in the second direction D2. When viewed in a plan view, some surfaces of the intermediate insulating pattern 150 may face the first direction D1, and other surfaces of the intermediate insulating pattern 150 may face a direction perpendicular to the fifth direction D5.

Each of the connection patterns XP may be disposed between the bit line contact DC and the separation insulating pattern 130, which are adjacent to each other in the second direction D2. Each of the connection patterns XP may include a first surface S1 facing the separation insulating pattern 130 adjacent thereto, and a second surface S2 facing the bit line contact DC adjacent thereto. The first surface S1 may extend in the fifth direction D5. The second surface S2 may have a profile concavely recessed from the adjacent bit line contact DC when viewed in a plan view.

Referring to FIG. 9, the separation insulating patterns 130 may extend in a sixth direction D6. The sixth direction D6 may intersect the first to third and fifth directions D1, D2, D3 and D5 and may be parallel to the bottom surface of the substrate 100.

Each of the intermediate insulating patterns 150 may have a bar shape extending lengthwise in the second direction D2. When viewed in a plan view, some surfaces of the intermediate insulating pattern 150 may face the first direction D1, and other surfaces of the intermediate insulating pattern 150 may face a direction perpendicular to the sixth direction D6.

Each of the connection patterns XP may include a first surface S1 facing the separation insulating pattern 130 adjacent thereto, and a second surface S2 facing the bit line contact DC adjacent thereto. The first surface S1 may extend in the sixth direction D6. The second surface S2 may have a profile concavely recessed from the adjacent bit line contact DC when viewed in a plan view.

FIGS. 10, 11A, 11B, 12, 13A, 13B, 14, 15A, 15B, 16, 17A and 17B are views illustrating stages in a method of manufacturing the semiconductor memory device of FIG. 2, FIGS. 10, 12, 14 and 16 are plan views corresponding to portion 'P1' of FIG. 1, FIGS. 11A, 13A, 15A and 17A are cross-sectional views taken along lines A-A' of FIGS. 10, 12, 14 and 16, respectively, and FIGS. 11B, 13B, 15B and 17B are cross-sectional views taken along lines B-B' of FIGS. 10, 12, 14 and 16, respectively. FIG. 18 is an enlarged view of portion 'P5' of FIG. 17A. A method of manufacturing a semiconductor memory device according to some embodiments will be described hereinafter. The descriptions to the same features as mentioned above will be omitted hereinafter for the purpose of ease and convenience in explanation.

Figure 10:
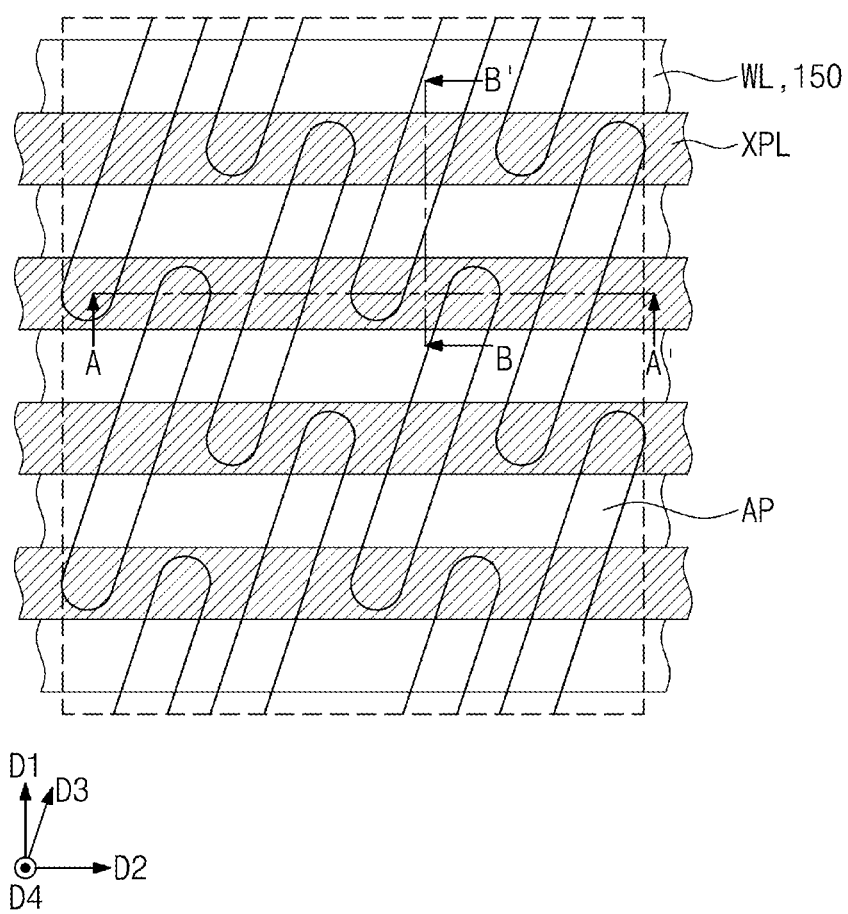
FIGS. 10, 11A, 11B, 12, 13A, 13B, 14, 15A, 15B, 16, 17A and 17B are views illustrating stages in a method of manufacturing the semiconductor memory device of FIG. 2.
Figure 11A:
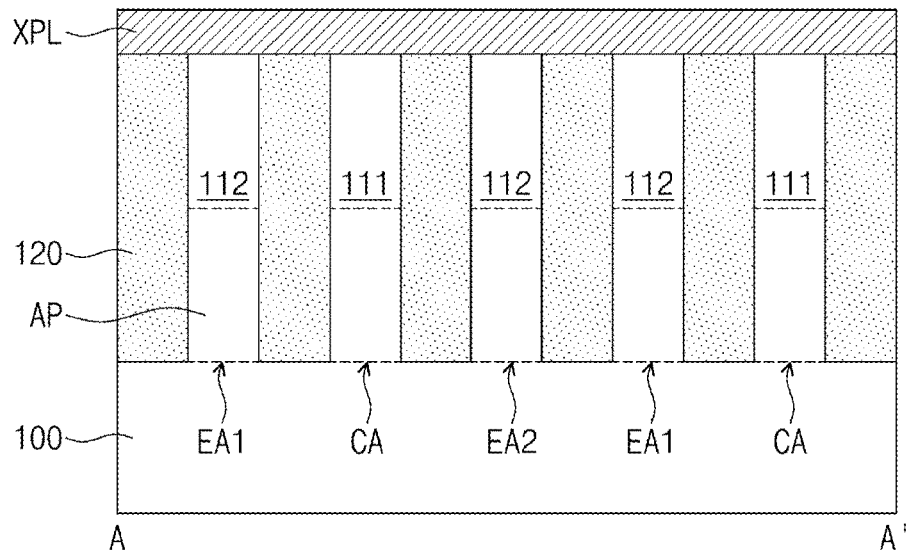
Figure 11A:
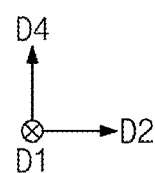
Figure 11B:
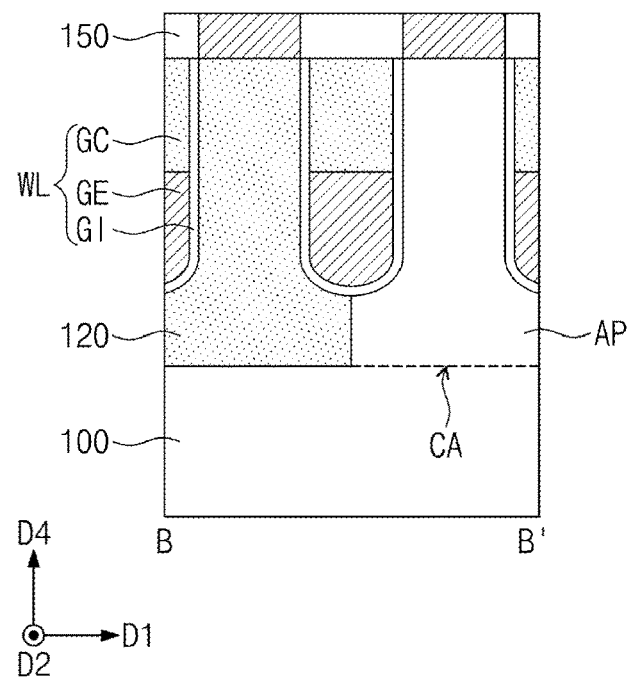

Referring to FIGS. 10, 11A and 111B, the device isolation pattern 120 and the active patterns AP may be formed in the substrate 100. The formation of the device isolation pattern 120 and the active patterns AP may include forming a groove in the substrate 100 by a patterning process, and filling the groove with an insulating material to form the device isolation pattern 120. The active patterns AP may be portions of the substrate 100, in which the groove is not formed.

Each of the active patterns AP may include the central portion CA, the first end portion EA1, and the second end portion EA2. Dopants may be injected or implanted into the active patterns AP to form the first dopant regions 111 in the central portions CA and to form the second dopant regions 112 in the first and second end portions EA1 and EA2. For example, the first and second dopant regions 111 and 112 may include dopants having the same conductivity type (e.g., an N-type).

The word lines WL may be formed in trenches formed in an upper portion of the substrate 100. The formation of the word lines WL may include forming mask patterns on the active patterns AP and the device isolation pattern 120, performing an anisotropic etching process using the mask patterns as etch masks to form the trenches, and filling the trenches with the word lines WL. The word lines WL may be spaced apart from each other in the first direction D1 and may extend in the second direction D2 in the active patterns AP. For example, the filling of the trenches with the word lines WL may include conformally depositing the gate dielectric pattern GI on an inner surface of each of the trenches, filling the trenches with a conductive layer, performing an etch-back process and/or a polishing process on the conductive layer to form the gate electrode GE, and forming the gate capping pattern GC filling a remaining portion of each of the trenches on the gate electrode GE.

Connection lines XPL may be formed on the substrate 100. The connection lines XPL may be spaced apart from each other in the first direction D1 on the active patterns AP and the device isolation pattern 120, and may extend in the second direction D2.

The method of forming the connection lines XPL may be various and is not limited to a specific embodiment. For example, the formation of the connection lines XPL may include forming a connection layer on the substrate 100, patterning the connection layer to divide the connection layer into the connection lines XPL extending in the second direction D2, and filling spaces between the connection lines XPL with the intermediate insulating patterns 150 extending in the second direction D2. In another example, the formation of the connection lines XPL may include forming trenches disposed between upper portions of the word lines WL and extending in the second direction D2, forming a connection layer filling the trenches and covering the word lines WL, and removing an upper portion of the connection layer to form the connection lines XPL separated from each other and filling the trenches, respectively. In this case, the intermediate insulating patterns 150 may be formed together, and the intermediate insulating patterns 150 may be portions of the gate capping patterns GC. For example, the connection lines XPL may include dopant-doped or undoped poly-silicon, or a metal material.

Figure 12:
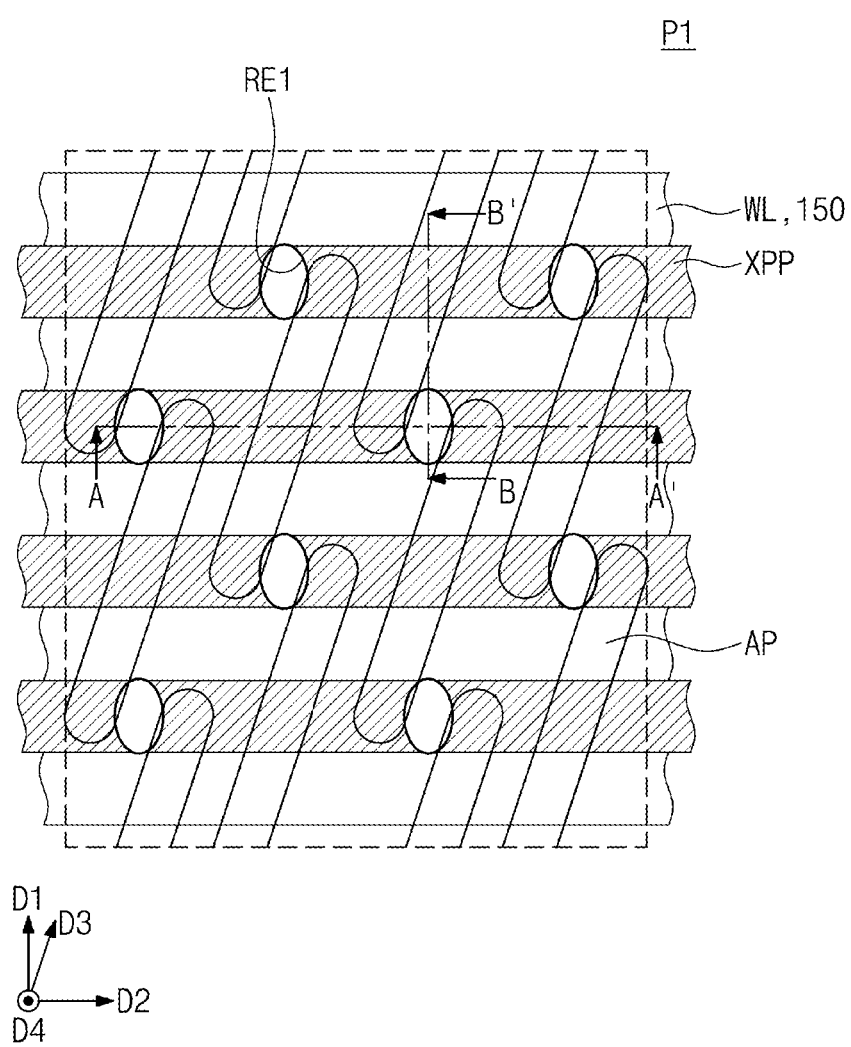
Figure 13A:
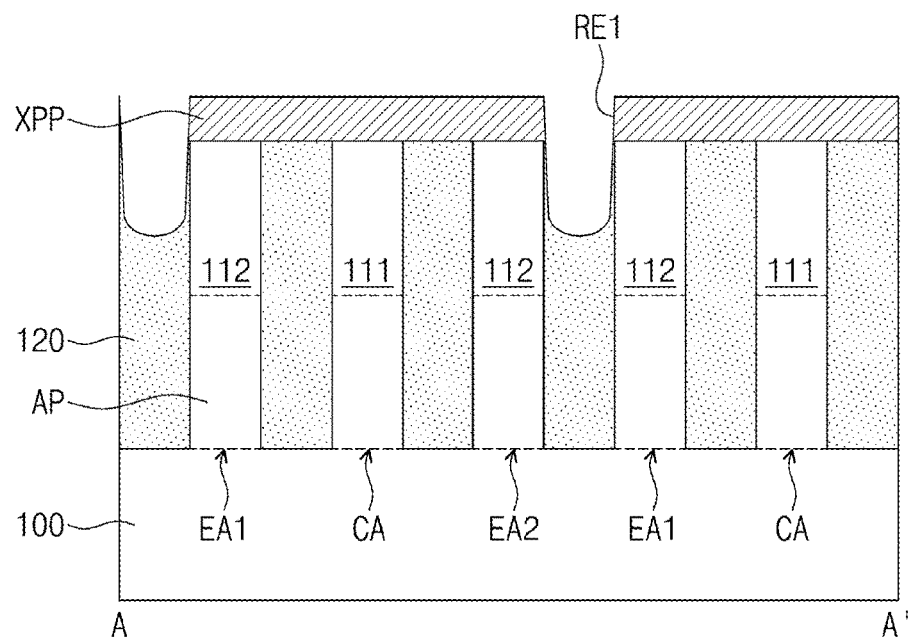
Figure 13B:
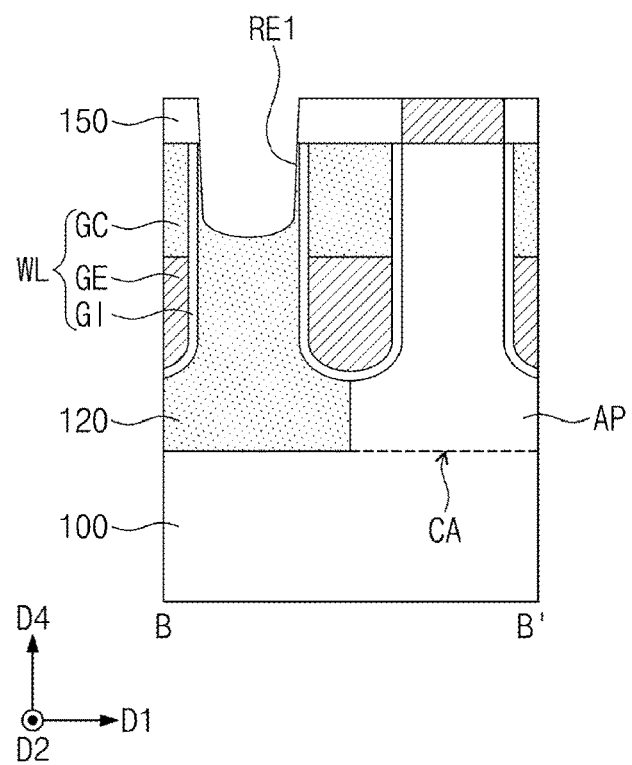

Referring to FIGS. 12, 13A and 13B, the first recess regions RE1 may be formed adjacent to the first and second end portions EA1 and EA2. More particularly, each of the first recess regions RE1 may be formed between the first end portion EA1 of one of a pair of the active patterns AP adjacent to each other in the first direction D1 and the second end portion EA2 of the other of the pair of active patterns AP. Each of the first recess regions RE1 may be spaced apart from the central portions CA when viewed in a plan view. For example, the first recess regions RE1 may be spaced apart from each other in the first and second directions D1 and D2.

The formation of the first recess regions RE1 may include forming mask patterns on the substrate 100, and performing an anisotropic etching process using the mask patterns as etch masks to pattern the connection lines XPL and the device isolation pattern 120. Each of the connection lines XPL may be divided into a plurality of preliminary connection patterns XPP by the anisotropic etching process. The first recess regions RE1 may expose side surfaces of the preliminary connection patterns XPP, side surfaces of the intermediate insulating patterns 150, and portions of the device isolation pattern 120 to the outside.

Figure 14:
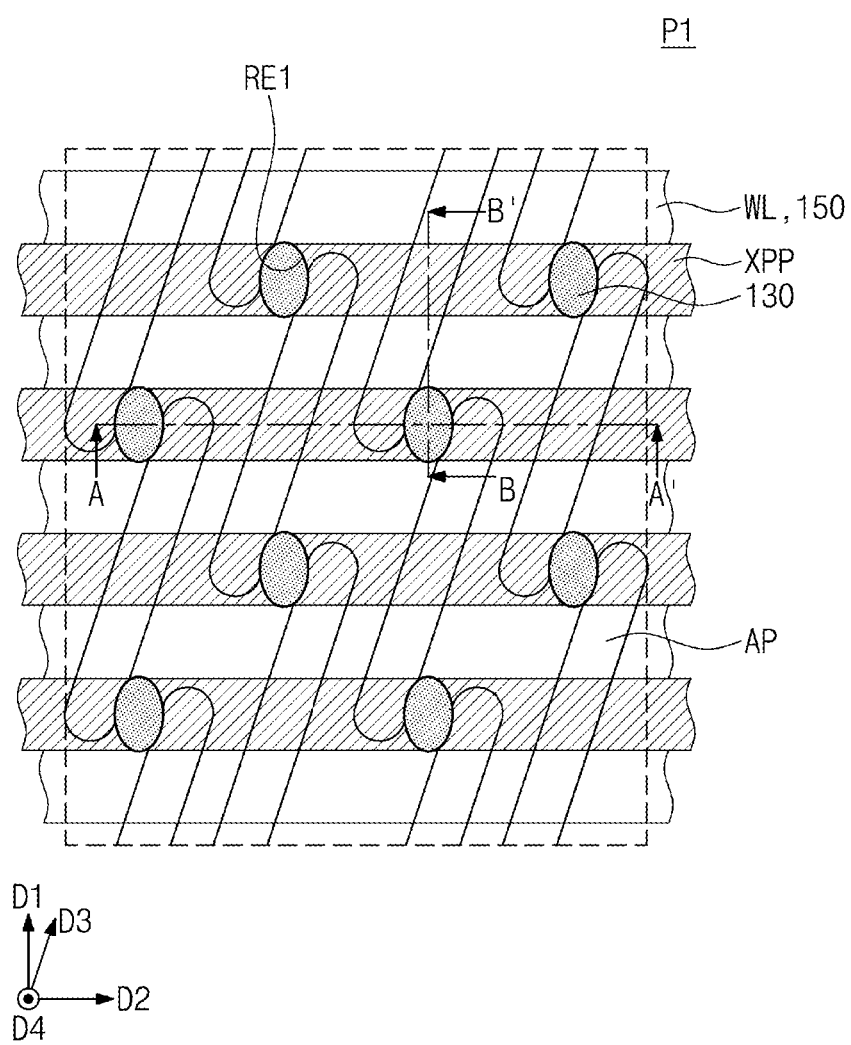
Figure 15A:
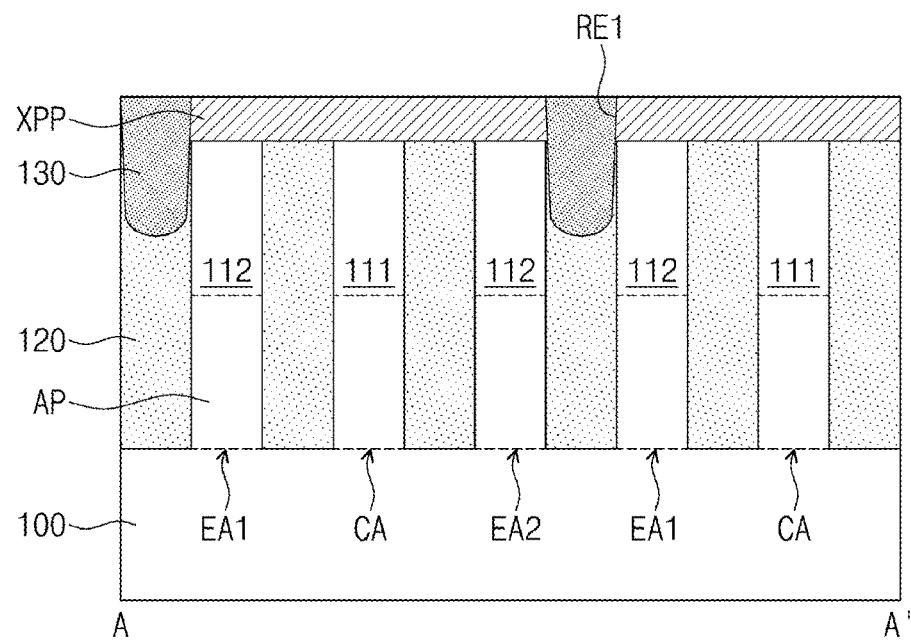
Figure 15A:
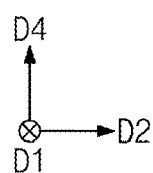
Figure 15B:
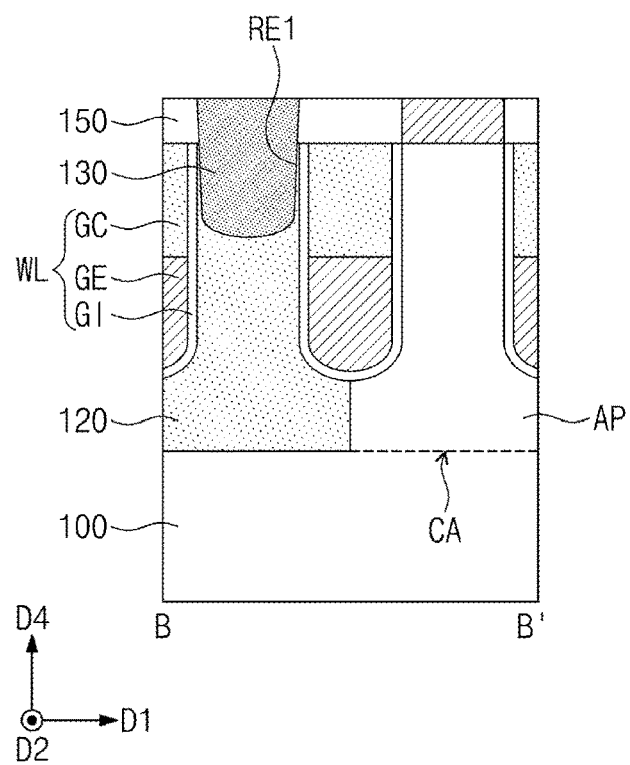
Figure 15B:
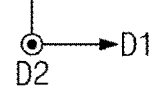

Referring to FIGS. 14, 15A and 15B, the separation insulating patterns 130 may be formed in the first recess regions RE1. The formation of the separation insulating patterns 130 may include forming a separation insulating layer, e.g., completely, filling the first recess regions RE1 and covering top surfaces of the preliminary connection patterns XPP, and dividing the separation insulating layer into a plurality of the separation insulating patterns 130 by an etch-back process or a polishing process. The top surfaces of the preliminary connection patterns XPP may be exposed to the outside in the dividing of the separation insulating layer into the separation insulating patterns 130.

Like the first recess regions RE1, each of the separation insulating patterns 130 may be formed between the first end portion EA1 of one of the pair of active patterns AP adjacent to each other in the first direction D1 and the second end portion EA2 of the other of the pair of active patterns AP. Each of the separation insulating patterns 130 may be spaced apart from the central portions CA when viewed in a plan view. For example, the separation insulating patterns 130 may be spaced apart from each other in the first and second directions D1 and D2.

Referring to FIGS. 16, 17A, 17B and 18, a buffer layer may be formed to cover top surfaces of the separation insulating patterns 130 and the top surfaces of the preliminary connection patterns XPP. Thereafter, the second recess regions RE2 may be formed on the central portions CA of the active patterns AP. The formation of the second recess regions RE2 may include forming mask patterns on the buffer layer, and performing an anisotropic etching process using the mask patterns as etch masks to pattern the buffer layer and the preliminary connection patterns XPP. By the etching process, the buffer pattern 210 and the connection patterns XP may be formed from the buffer layer and the preliminary connection patterns XPP, respectively, and the top surfaces CAa of the central portions CA may be exposed to the outside. The buffer pattern 210 may cover top surfaces of the connection patterns XP.

The second recess regions RE2 may be spaced apart from the first recess regions RE1. The second recess regions RE2 may be spaced apart from each other in the first and second directions D1 and D2. Each of the second recess regions RE2 may be formed between the first recess regions RE1 adjacent to each other.

Bottom surfaces of the second recess regions RE2 may be located at a higher height than bottom surfaces of the first recess regions RE1, e.g., relative to the bottom surface of the substrate 100. A depth DT3 from the top surfaces EAa of the first and second end portions EA1 and EA2 to the bottom surfaces of the second recess regions RE2 may be less than a depth DT2 from the top surfaces EAa of the first and second end portions EA1 and EA2 to the bottom surfaces 130b of the separation insulating patterns 130 (i.e., the bottom surfaces of the first recess regions RE1).

The second recess regions RE2 may expose the central portions CA, the device isolation pattern 120 adjacent to the central portions CA, side surfaces of the connection patterns XP, side surfaces of the intermediate insulating patterns 150, and a side surface of the buffer pattern 210 to the outside. For example, as illustrated in FIG. 18, upper portions of the central portions CA may be etched by the etching process, and thus the top surfaces CAa of the central portions CA may be located at a lower height than the top surfaces EAa of the first and second end portions EA1 and EA2. Portions of the device isolation pattern 120 may be exposed to the outside by inner side surfaces of the second recess regions RE2.

Referring again to FIGS. 2, 3, 4A and 4B, the contact spacers 220 may be formed on the inner side surfaces of the second recess regions RE2. Thereafter, the bit line contacts DC, the bit lines BL, and the bit line capping patterns 350 may be formed on the central portions CA. The formation of the bit line contacts DC, the bit lines BL, and the bit line capping patterns 350 may include forming a bit line contact layer filling the second recess regions RE2, sequentially forming a bit line layer, a bit line capping layer, and mask patterns on the bit line contact layer, and anisotropically etching the bit line contact layer, the bit line layer, and the bit line capping layer using the mask patterns as etch masks to form the bit line contacts DC, the bit lines BL, and the bit line capping patterns 350. The bit line layer may include a first barrier layer and a metal-containing layer which are sequentially stacked, and each of the bit lines BL may include a first barrier pattern 332 and a metal-containing pattern 330 which are formed therefrom, respectively. Each of the bit line contacts DC may be formed in each of the second recess regions RE2. In the etching process, portions of the contact spacers 220 (e.g., portions of the contact spacers 220, not covered by the bit lines BL) may also be etched, and the inner side surfaces of the second recess regions RE2 may be exposed to the outside.

Thereafter, the first filling pattern 240 and the second filling pattern 250 may be formed to fill a remaining portion of each of the second recess regions RE2. The formation of the first and second filling patterns 240 and 250 may include forming the first filling pattern 240 conformally covering an inner surface of the remaining portion of each of the second recess regions RE2, and forming the second filling pattern 250 filling the remaining portion of each of the second recess regions RE2.

The bit line spacer SPC may be formed to cover a side surface of each of the bit lines BL and a side surface of each of the bit line capping patterns 350. The bit line spacer SPC may be formed of a single layer or multi-layer. For example, the bit line spacer SPC may include the inner spacer 323 and the outer spacer 325, which are sequentially stacked on the side surface of each of the bit lines BL. However, embodiments are not limited thereto, and in certain embodiments, the bit line spacer SPC may be formed of a single layer or three or more layers.

The contact plugs 420 may be formed between the bit lines BL adjacent to each other. The formation of the contact plugs 420 may include removing portions of the buffer pattern 210 on the connection patterns XP to expose the connection patterns XP to the outside, conformally forming second barrier patterns 410 on the bit line spacer SPC and the exposed connection patterns XP, and forming the contact plugs 420 between the adjacent bit lines BL. For example, the formation of the contact plugs 420 may further include performing an etch-back process or a polishing process, but embodiments are not limited thereto. In the process of forming the contact plugs 420, the ohmic pattern 425 may be formed between each of the contact plugs 420 and each of the connection patterns XP.

Even though not shown in the drawings, fence patterns may be formed between the adjacent bit lines BL. The contact plugs 420 may be spaced apart from each other in the first direction D1 by the fence patterns. In some embodiments, the fence patterns may be formed before the formation of the contact plugs 420, and each of the contact plugs 420 may be formed between the adjacent bit lines BL and between the fence patterns adjacent to each other in the first direction D1. In certain embodiments, the fence patterns may be formed after the formation of the contact plugs 420, and each of the fence patterns may be formed between the adjacent bit lines BL and between the contact plugs 420 adjacent to each other in the first direction D1.

Landing pads 430 may be formed on the contact plugs 420. The formation of the landing pads 430 may include sequentially forming a landing pad layer covering top surfaces of the contact plugs 420 and mask patterns, and dividing the landing pad layer into the landing pads 430 by an anisotropic etching process using the mask patterns as etch masks. A portion of an upper portion of the second barrier pattern 410, a portion of an upper portion of the contact plug 420, and a portion of an upper portion of the bit line capping pattern 350 may be further etched by the etching process, and thus the second barrier pattern 410, the contact plug 420, and the bit line capping pattern 350 may be exposed to the outside. Thereafter, the gap-fill pattern 440 may be formed to cover the exposed portions and to surround each of the landing pads 430, and the data storage pattern DSP may be formed on each of the landing pads 430.

The top surface CAa of the central portion CA should be exposed to the outside to connect the bit line contact DC to the central portion CA of the active pattern AP, and the second recess region RE2 may be formed to expose the top surface CAa of the central portion CA. If the first recess region RE1 were to be formed on the central portion CA before the formation of the second recess region RE2, the second recess region RE2 would have been formed deeper than the first recess region RE1 to expose the top surface CAa of the central portion CA.

According to embodiments, the first recess region RE1 may be formed at a position spaced apart from a position at which the second recess region RE2 is formed. Thus, even though the second recess region RE2 is shallower than the first recess region RE1, the top surface CAa of the central portion CA may be exposed to the outside. Accordingly, a required total etching amount may be reduced in the etching process described with reference to FIGS. 2 to 5 to form the bit line contact DC in the second recess region RE2, and thus the semiconductor memory device may be easily manufactured. In addition, over-etching of the bit line BL in the process of forming the bit line contact DC may be prevented due to the reduction in the etching amount, and thus electrical characteristics and reliability of the semiconductor memory device may be improved.

Figure 17A:
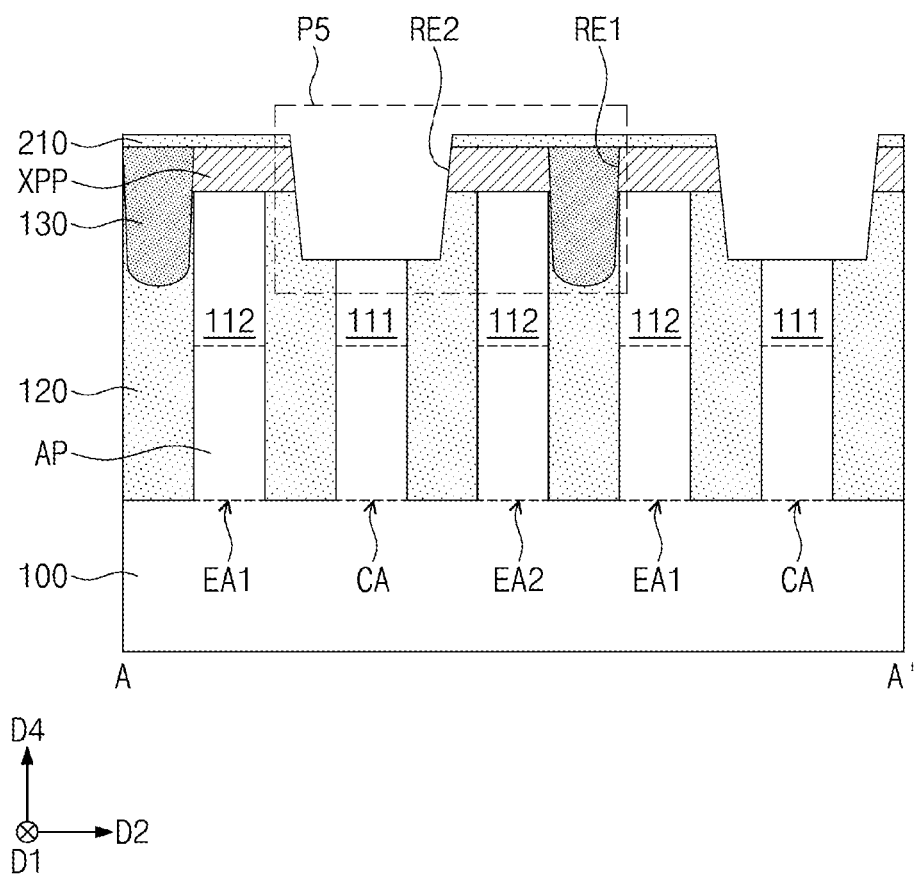
Figure 17B:
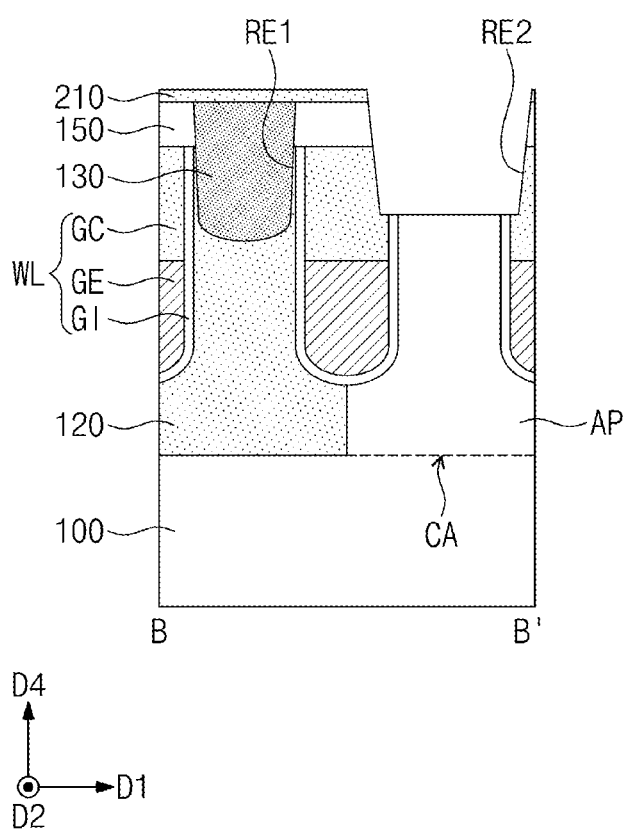
Figure 18:
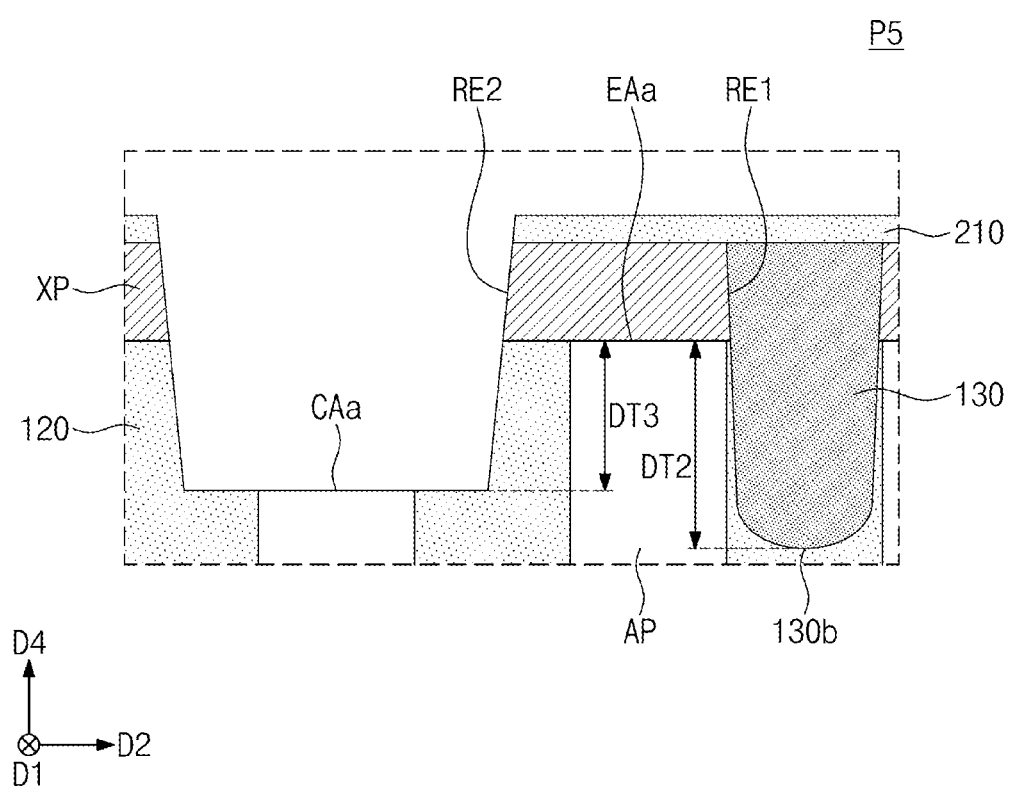
FIGS. 18 and 19 are enlarged views of portion 'P5' of FIG. 17A.
Figure 19:
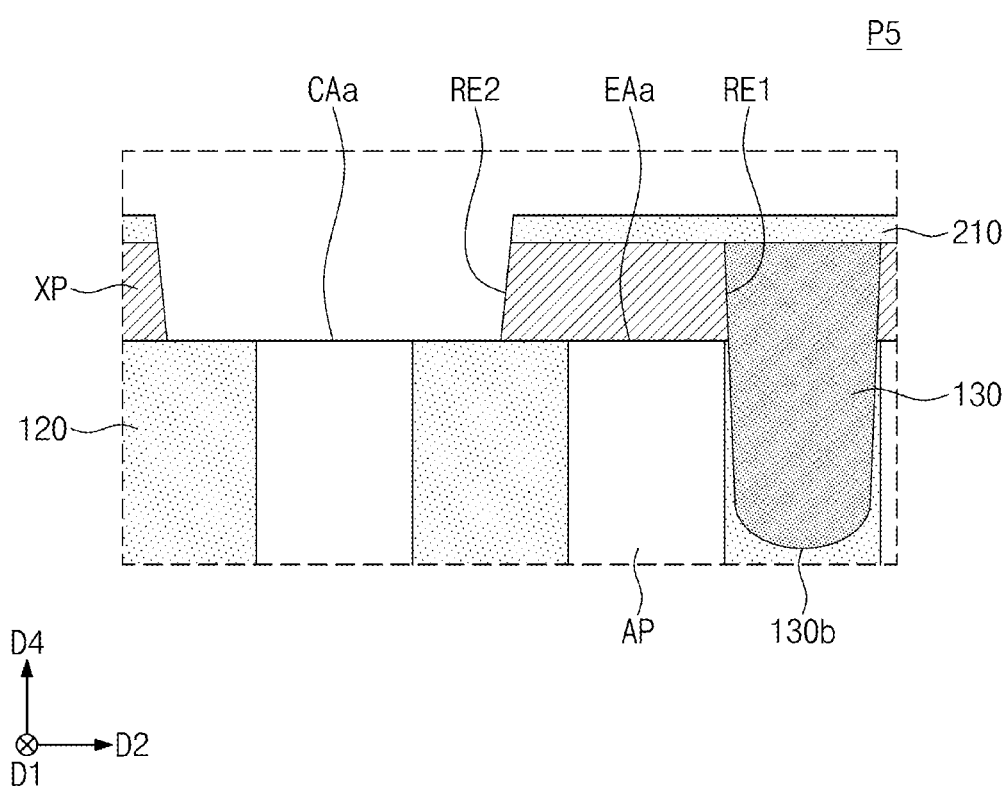

FIG. 19 is an enlarged view of portion 'P5' of FIG. 17A. Hereinafter, the descriptions to the same features as mentioned above will be omitted for the purpose of ease and convenience in explanation.

Figure 16:
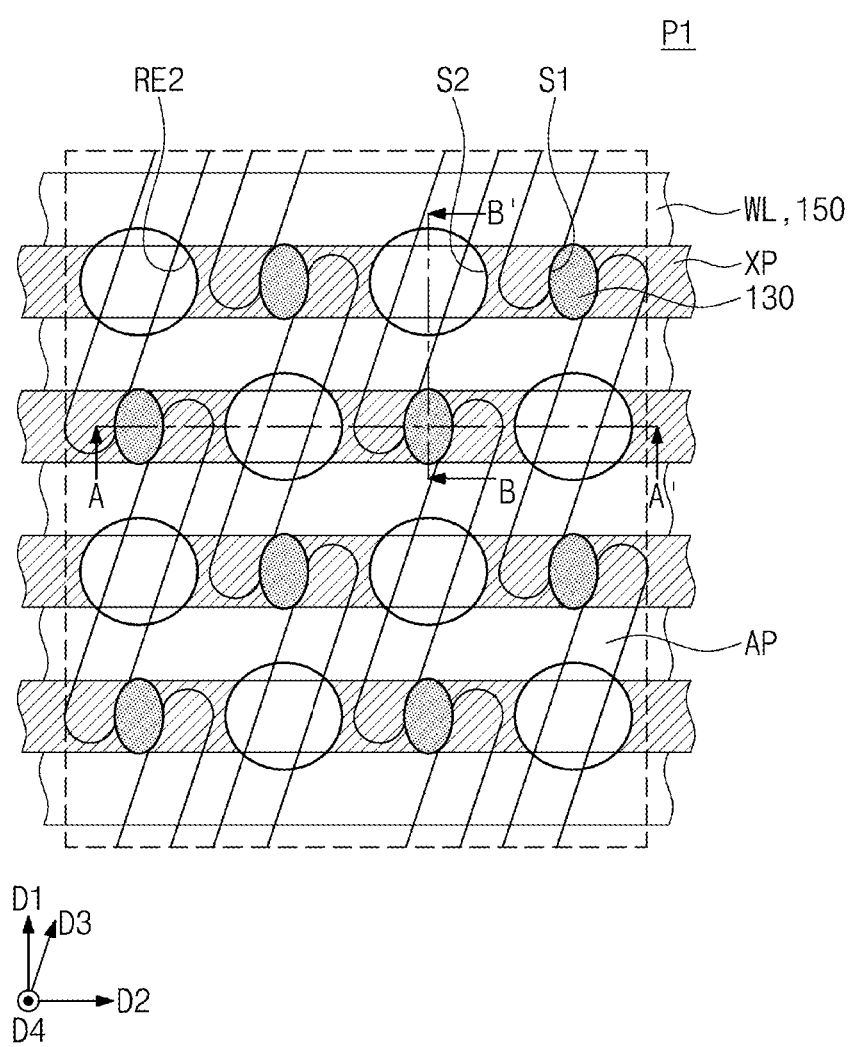

Referring to FIGS. 16 and 19, the second recess regions RE2 may be formed on the central portions CA of the active patterns AP by an etching process. The top surfaces CAa of the central portions CA may be exposed to the outside through the etching process, and the central portions CA may not be etched. The top surfaces CAa of the central portions CA may be located at substantially the same height as the top surfaces EAa of the first and second end portions EA1 and EA2. The second recess regions RE2 may be formed at a higher height than the top surfaces EAa of the first and second end portions EA1 and EA2. Thereafter, the subsequent processes described with reference to FIGS. 2, 3, 4A and 4B may be performed to form the structure of the semiconductor memory device of FIG. 6.

Figure 20:
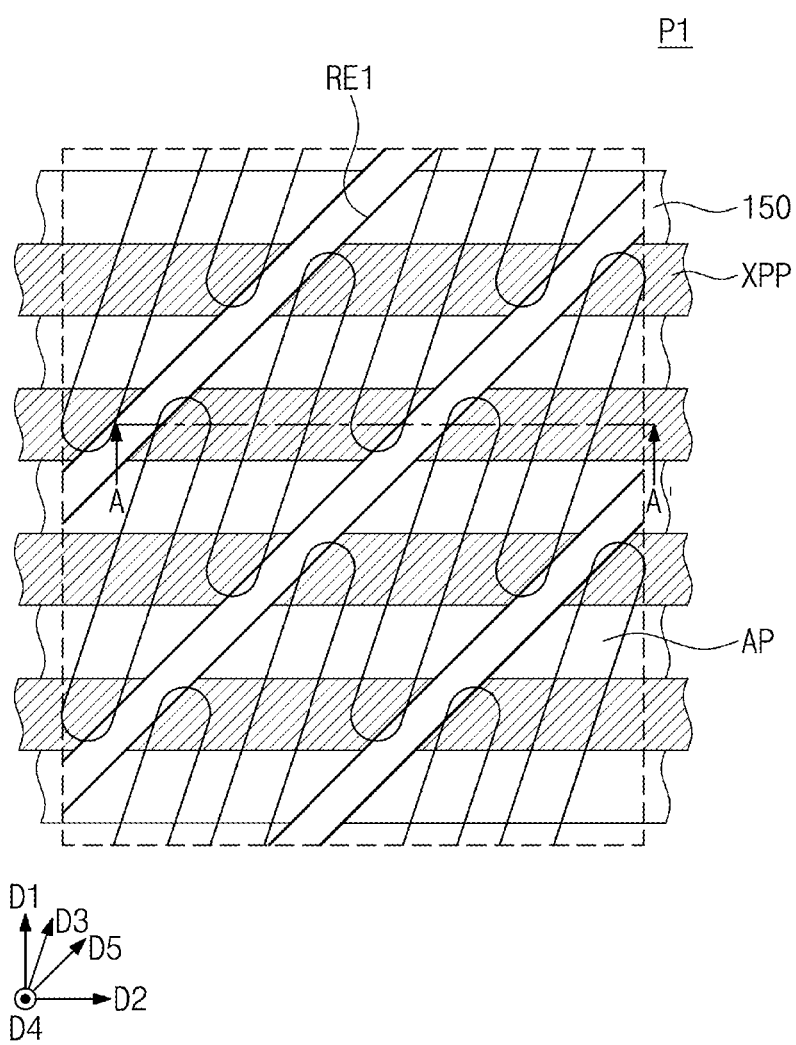
FIGS. 20 to 22 are plan views of portion 'P1' of FIG. 1.
Figure 21:
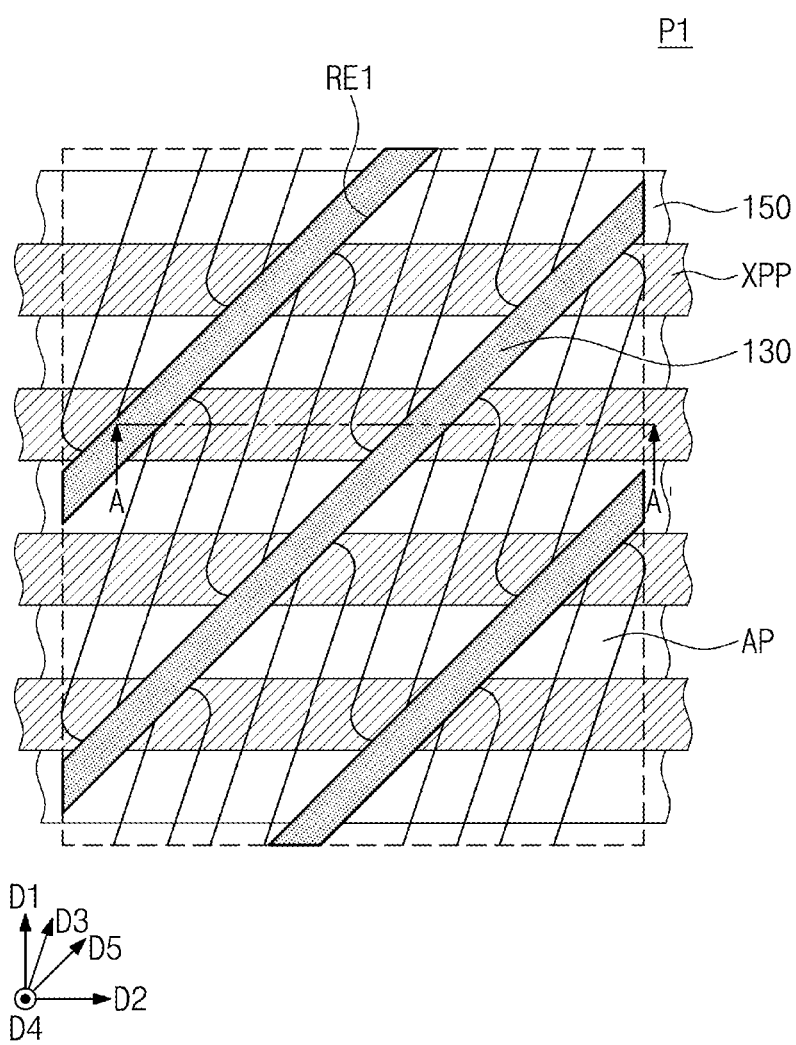
Figure 22:
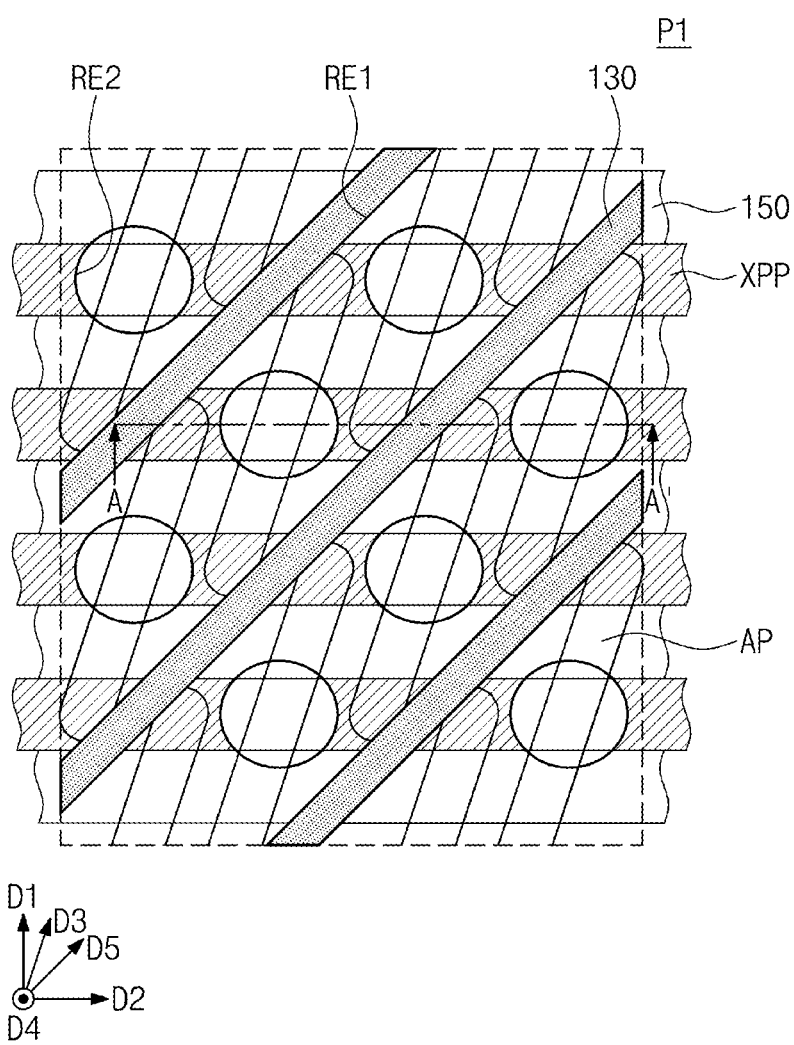

FIGS. 20 to 22 are plan views corresponding to portion 'P1' of FIG. 1 to illustrate a method of manufacturing the semiconductor memory device of FIG. 7. Hereinafter, the descriptions to the same features as mentioned above will be omitted for the purpose of ease and convenience in explanation.

Referring to FIG. 20, first recess regions RE1 may be formed adjacent to the first and second end portions EA1 and EA2. More particularly, each of the first recess regions RE1 may be formed between the first end portion EA1 of one of a pair of the active patterns AP adjacent to each other in the first direction D1 and the second end portion EA2 of the other of the pair of active patterns AP. Each of the first recess regions RE1 may be spaced apart from the central portions CA when viewed in a plan view. For example, each of the first recess regions RE1 may extend in the fifth direction D5.

Referring to FIG. 21, the separation insulating patterns 130 may be formed in the first recess regions RE1. Like the first recess regions RE1, each of the separation insulating patterns 130 may be formed between the first end portion EA1 of one of the pair of active patterns AP adjacent to each other in the first direction D1 and the second end portion EA2 of the other of the pair of active patterns AP. Each of the separation insulating patterns 130 may be spaced apart from the central portions CA when viewed in a plan view. For example, each of the separation insulating patterns 130 may extend in the fifth direction D5.

Referring to FIG. 22, the second recess regions RE2 may be formed on the central portions CA. The second recess regions RE2 may be spaced apart from the first recess regions RE1. The second recess regions RE2 may be formed between the first recess regions RE1 adjacent to each other. A line of the second recess regions RE2 may be arranged in the fifth direction D5 between the adjacent first recess regions RE1. Thereafter, the subsequent processes described with reference to FIGS. 2, 3, 4A and 4B may be performed to form the structure of the semiconductor memory device of FIG. 7.

By way of summation and review, embodiments provide a semiconductor memory device capable of being easily manufactured, and a method of manufacturing the same. Embodiments also provide a semiconductor memory device with improved electrical characteristics and reliability, and a method of manufacturing the same.

That is, according to embodiments, a required etching amount may be reduced in the etching process for forming the bit line contact, and thus the semiconductor memory device may be easily manufactured. In addition, over-etching of the bit line in the process of forming the bit line contact may be prevented due to the reduction in the etching amount, and thus the electrical characteristics and reliability of the semiconductor memory device may be improved.

Example embodiments have been disclosed herein, and although specific terms are employed, they are used in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device, comprising:
active patterns spaced apart from each other in a first direction and a second direction intersecting the first direction, each of the active patterns including a central portion, a first end portion, and a second end portion;
bit line contacts spaced apart from each other in the first direction and the second direction, each of the bit line contacts being on a corresponding central portion;
separation insulating patterns between the bit line contacts, each of the separation insulating patterns being between adjacent ones of the bit line contacts in the first direction and the second direction;
intermediate insulating patterns between the bit line contacts and the separation insulating patterns, each of the intermediate insulating patterns being between one of the bit line contacts and one of the separation insulating patterns that are adjacent to each other in the first direction; and
connection patterns between the bit line contacts and the separation insulating patterns, each of the connection patterns being between one of the bit line contacts and one of the separation insulating patterns that are adjacent to each other in the second direction.

2. The semiconductor memory device as claimed in claim 1, wherein bottom surfaces of the bit line contacts are at a higher height than bottom surfaces of the separation insulating patterns.

3. The semiconductor memory device as claimed in claim 1, wherein a depth from top surfaces of the first and second end portions to bottom surfaces of the bit line contacts is less than a depth from the top surfaces of the first and second end portions to bottom surfaces of the separation insulating patterns.

4. The semiconductor memory device as claimed in claim 1, wherein a top surface of the central portion is at a substantially same height as or a lower height than top surfaces of the first and second end portions.

5. The semiconductor memory device as claimed in claim 1, wherein each of the separation insulating patterns is between the first end portion of a first one of a pair of the active patterns and the second end portion of a second one of the pair of the active patterns, the pair of the active patterns being adjacent to each other in the first direction.

6. The semiconductor memory device as claimed in claim 1, wherein:
the bit line contacts include a line of the bit line contacts arranged in the first direction,
the separation insulating patterns include a line of the separation insulating patterns arranged in the first direction, and
the line of the bit line contacts and the line of the separation insulating patterns are alternately arranged in the first direction.

7. The semiconductor memory device as claimed in claim 1, wherein:

each of the connection patterns includes a first surface facing an adjacent one of the separation insulating patterns in the second direction, and the first surface is concavely recessed from the adjacent one of the separation insulating patterns when viewed in a plan view.

8. The semiconductor memory device as claimed in claim 7, wherein:

each of the connection patterns further includes a second surface facing an adjacent one of the bit line contacts in the second direction, and the second surface is concavely recessed from the adjacent one of the bit line contacts when viewed in a plan view.

9. The semiconductor memory device as claimed in claim 1, wherein the intermediate insulating patterns extend in the second direction and are spaced apart from each other in the first direction.

10. The semiconductor memory device as claimed in claim 1, wherein the separation insulating patterns extend in a third direction intersecting the first and second directions.

11. The semiconductor memory device as claimed in claim 1, wherein:

each of the connection patterns includes a first surface facing an adjacent one of the separation insulating patterns in the second direction, and the first surface extends in a third direction intersecting the first direction and the second direction.

12. The semiconductor memory device as claimed in claim 11, wherein:

each of the connection patterns further includes a second surface facing an adjacent one of the bit line contacts in the second direction, and the second surface is concavely recessed from the adjacent one of the bit line contacts when viewed in a plan view.

13. The semiconductor memory device as claimed in claim 1, wherein each of the intermediate insulating patterns has a bar shape extending lengthwise in the second direction.

14. A semiconductor memory device, comprising:

active patterns spaced apart from each other in a first direction and a second direction intersecting the first direction, each of the active patterns including a central portion, a first end portion, and a second end portion;

bit line contacts spaced apart from each other in the first direction and the second direction, each of the bit line contacts being on a corresponding central portion;

separation insulating patterns between the bit line contacts, each of the separation insulating patterns extending in a third direction intersecting the first direction and the second direction; and connection patterns between the bit line contacts and the separation insulating patterns, each of the connection patterns being between one of the bit line contacts and one of the separation insulating patterns that are adjacent to each other in the second direction.

15. The semiconductor memory device as claimed in claim 14, wherein bottom surfaces of the bit line contacts are at a higher height than bottom surfaces of the separation insulating patterns.

16. The semiconductor memory device as claimed in claim 14, wherein a depth from top surfaces of the first and second end portions to bottom surfaces of the bit line contacts is less than a depth from the top surfaces of the first and second end portions to bottom surfaces of the separation insulating patterns.

17. A semiconductor memory device, comprising:

active patterns spaced apart from each other in a first direction and a second direction intersecting the first direction, each of the active patterns including a central portion, a first end portion, and a second end portion;

word lines extending in the second direction in the active patterns;

bit line contacts spaced apart from each other in the first direction and the second direction, each of the bit line contacts being on a corresponding central portion;

bit lines extending in the first direction on the bit line contacts;

separation insulating patterns between the bit line contacts, each of the separation insulating patterns being between adjacent ones of the bit line contacts in the first direction and the second direction;

contact plugs between the bit lines;

intermediate insulating patterns between the bit line contacts and the separation insulating patterns, each of the intermediate insulating patterns being between one of the bit line contacts and one of the separation insulating patterns that are adjacent to each other in the first direction;

connection patterns between the bit line contacts and the separation insulating patterns, each of the connection patterns connecting between each of the first and second end portions to each of the contact plugs that are adjacent to each other in the second direction;

landing pads on the contact plugs; and data storage patterns connected to the first and second end portions through the contact plugs and the landing pads.

18. The semiconductor memory device as claimed in claim 17, wherein bottom surfaces of the bit line contacts are at a higher height than bottom surfaces of the separation insulating patterns.

19. The semiconductor memory device as claimed in claim 17, wherein:

the bit line contacts include a line of the bit line contacts arranged in the first direction, the separation insulating patterns include a line of the separation insulating patterns arranged in the first direction, and the line of the bit line contacts and the line of the separation insulating patterns are alternately arranged in the first direction.

20. The semiconductor memory device as claimed in claim 17, wherein the separation insulating patterns extend in a third direction intersecting the first direction and the second direction.

* * * * *